United States Patent [19]
Young et al.

[11] Patent Number: 6,051,489
[45] Date of Patent: Apr. 18, 2000

[54] ELECTRONIC COMPONENT PACKAGE WITH POSTS ON THE ACTIVE SIDE OF THE SUBSTRATE

[75] Inventors: James L. Young, Mountain View; Changsheng Chen, Santa Clara, both of Calif.

[73] Assignee: ChipScale, Inc., San Jose, Calif.

[21] Appl. No.: 08/855,106

[22] Filed: May 13, 1997

[51] Int. Cl.[7] .................................................. H01L 21/44
[52] U.S. Cl. ...................... 438/612; 438/613; 438/614; 257/737; 257/780
[58] Field of Search .................................. 438/612, 613, 438/614, 615; 257/737, 780, 786, 781

[56] References Cited

U.S. PATENT DOCUMENTS

| | | | |
|---|---|---|---|
| 3,849,757 | 11/1974 | Khammous et al. | 338/320 |
| 5,200,733 | 4/1993 | Davis et al. | 338/64 |
| 5,208,656 | 5/1993 | Matsuyama et al. | 174/253 |
| 5,280,194 | 1/1994 | Richards et al. . | |
| 5,323,138 | 6/1994 | Oki et al. | 338/307 |
| 5,393,697 | 2/1995 | Chang et al. | 437/183 |
| 5,403,729 | 4/1995 | Richards et al. . | |
| 5,441,898 | 8/1995 | Richards et al. . | |
| 5,444,009 | 8/1995 | Richards et al. . | |
| 5,455,187 | 10/1995 | Richards et al. . | |
| 5,468,672 | 11/1995 | Rosvold | 437/60 |
| 5,483,741 | 1/1996 | Akram et al. | 438/614 |
| 5,508,228 | 4/1996 | Nolan et al. | 438/614 |
| 5,521,104 | 5/1996 | Walker | 437/3 |
| 5,521,420 | 5/1996 | Richards et al. . | |
| 5,557,149 | 9/1996 | Richards et al. . | |
| 5,592,022 | 1/1997 | Richards et al. . | |
| 5,607,877 | 3/1997 | Matsuda et al. | 438/613 |
| 5,656,547 | 8/1997 | Richards et al. . | |

FOREIGN PATENT DOCUMENTS

| | | |
|---|---|---|
| 2320631 | 3/1977 | France . |
| 05-144823 | 6/1993 | Japan . |
| 05-251455 | 9/1993 | Japan . |

OTHER PUBLICATIONS

PCT/US98/09792 Written Opinion, 9 pages.
Charles Gayne and Robert Preston "Surface–Mount Packages Extend Diodes Past 5.8 GHz", Microwaves & RF, Dec. 1998, pp. 234–239.
The Micro Grid Array (MGA), updated Jul. 27, 1997, available from Internet url:http://www.chipscale.com/mgat-ech.htm, Sep. 8, 1998.
PCT/US 98/09793 International Search Report.
PCT/ US 98/09792 International Search Report.

*Primary Examiner*—Kevin M. Picardat
*Attorney, Agent, or Firm*—Blakely, Sokoloff, Taylor & Zafman LLP

[57] ABSTRACT

A method and apparatus for an electronic component package using wafer level processing is provided. Posts are formed on the active side of the substrate of an electronic component. A conductive layer leads the contact areas of the electronic component to the tops of the posts. The conductive layer on the top of the posts acting as leads, attaching to traces on a printed circuit board.

38 Claims, 24 Drawing Sheets

1410

ELECTRONIC COMPONENT PACKAGE WITH POSTS ON THE ACTIVE SIDE OF THE SUBSTRATE

FIELD OF THE INVENTION

The present invention relates to electronic component packaging, and more specifically, to a wafer level processing for an electronic component packaging.

BACKGROUND OF THE INVENTION

Electronic components are packaged in order to interconnect them with other devices. The packaging of the electronic device usually includes contacts for transmitting signals providing power and ground connections between the internal circuitry of the device and external circuitry. Some examples of prior art contacts include wire bonds protruding from the ends of a discrete diode or resistor, or metal caps located on the ends of a fuse. Sophisticated electronic devices such as microprocessors may require several hundred contacts. Those devices are usually produced in a package having multiple pins for mounting to a printed circuit. The electronic component is typically placed in a package, and each contact area on the electronic component is wire bonded to the corresponding pin on the package. Because each wire bond is individually added to the circuit, however, large number of contacts make wire bonding expensive. Additionally, because of the precision required for wire bonding, wire bonding may result in short circuits and similar problems. Furthermore, wire bonds can degrade chip performance because of the length of the wires.

One prior art method of solving the problems of wire bonds is the flip chip. FIG. 1 illustrates a prior art electronic component that is packaged as a flip chip. The flip chip 110 includes an integrated circuit 120 (IC) and solder balls 140 attached to the IC 120. The IC 120 is a conventional integrated circuit, which has contact points, to which solder balls 140 are attached. The flip chip 110 is placed on a substrate 150 which includes a plurality of contact pads. The solder balls 140 of flip chip 110 are reflowed to attach the flip chip 110 to the contact pads on the substrate. In order to prevent solder joint failure caused by coefficient of thermal expansion (CTE) mismatch between substrate 150 and flip chip 110, the area between the solder balls 140 is filled with an underfill 130. This underfill 130 is injected between the IC 120 and the substrate 150. The underfill 130, substrate 150, IC 120 and solder balls 140 form a single unit.

The solder balls 140 act as attachment material that allows the flip chip 110 to be attached to the substrate 150. The silicon of the flip chip 110 and the substrate 150 usually have different CTEs and expand and contract at different rates due to thermal cycling. This lack of compliance causes failures.

Underfill 130 generally does not aid compliancy, but constrains the die, solder, and substrate so there will not be failure due to CTE mismatch. The underfill 130 requires extra processing steps, costs, and has other disadvantages.

Most flip chips can not be easily probed with standard testing equipment without causing possible damage to the solder balls. This leads to a chip which requires more expensive equipment for testing.

Furthermore, flip chips 110 generally have no compliancy mechanism to withstand thermal cycles. This lack of compliancy causes failures.

Furthermore, flip chips 110 generally place lead connections directly on the surface of the die. Because there is no compliancy in the flip chips, thermal cycling can cause significant stress on the die surface. Therefore, there should be no active surfaces directly below the bond pads or junction areas to which the solder balls are attached. This leads to a loss of silicon real estate.

Furthermore, in most cases the underfill 130 prevents rework of the die once the underfill 130 is added. The die may be removed, but it is no longer usable, and a new die must be used.

Furthermore, most flip chips 110 use solder balls 140 that are the same size on each die. This does not allow the use of a larger solder ball for power and smaller solder balls for signals in individual dies. Having connective surfaces (solder balls 140) of the same size also prevents the flip chip from providing a large contact area for heat sinks.

SUMMARY AND OBJECTS OF THE INVENTION

One object of the present invention is to provide for a circuit package which is manufacturable at a wafer level.

Another object of the present invention is to provide for a circuit package which provides flexibility and compliancy.

Another object of the present invention is to provide lead connections that can vary in size, in order to tailor the size of the lead for the purpose for which the lead is used.

Another object of the present invention is to provide an encapsulation of the package in order to provide protect the circuit.

Another object of the present invention is to provide lead connections that are not directly on the surface of the die, which allows for smaller bond pads/junction areas on the die, and the ability to minimize stress on the die surface.

Another object of the present invention is to provide an integrated heat sink for the chip package.

Another object of the present invention is to provide for the capability for testing a packaged electronic component at the wafer level using standard testing equipment.

A method and apparatus for an electronic component package using wafer level processing is described. An active side of the substrate of an electronic component is covered by an insulating layer, leaving contact points exposed. Posts are placed on the active side of the substrate of the electronic component. A conductive layer is deposited over the posts, the conductive layer in contact with the contact points of the integrated circuit. The conductive layer on the top of the posts is for coupling the package to traces on a printed circuit board.

Other objects, features, and advantages of the present invention will be apparent from the accompanying drawings and from the detailed description that follows below.

BRIEF DESCRIPTION OF THE DRAWINGS

The present invention is illustrated by way of example and not by way of limitation in the figures of the accompanying drawings and in which like reference numerals refer to similar elements and in which.

DETAILED DESCRIPTION

A method and apparatus for packaging of an electronic component die using wafer level processing is described.

Figure 1:
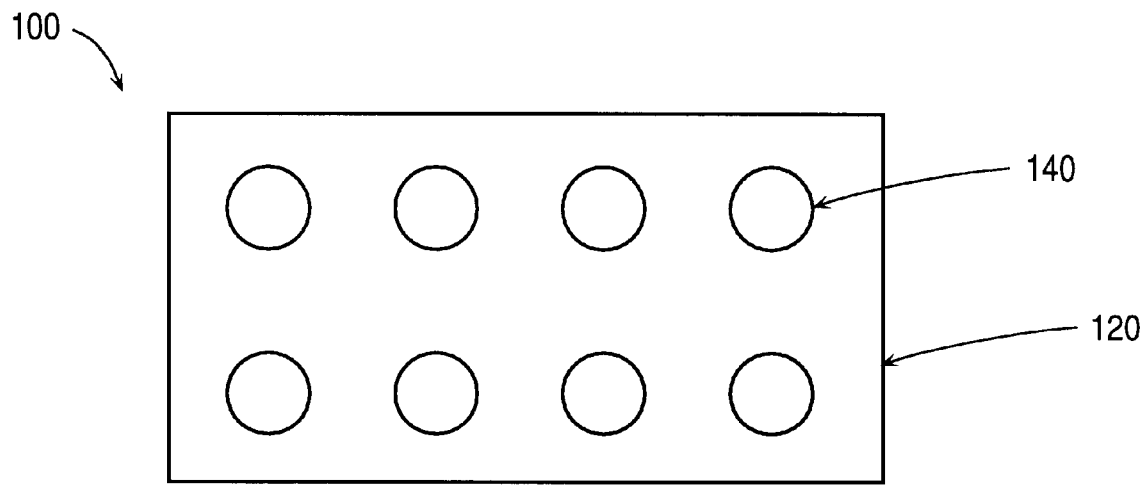
FIG. 1 illustrates a prior art integrated circuit that is packaged as a flip chip.
Figure 1:
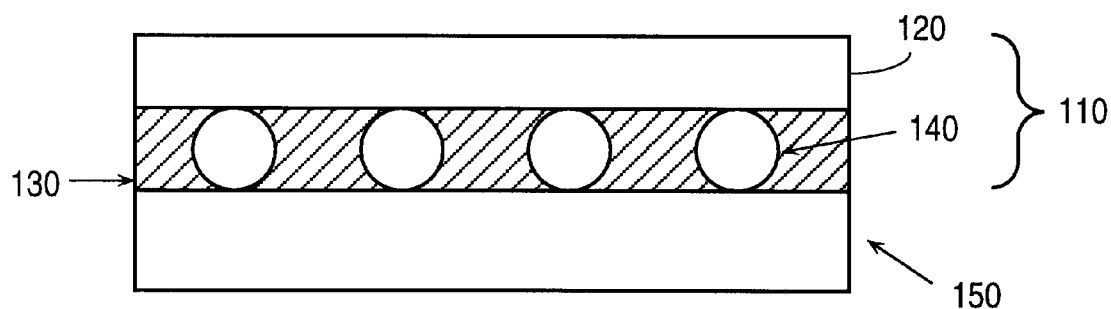
Figure 2:
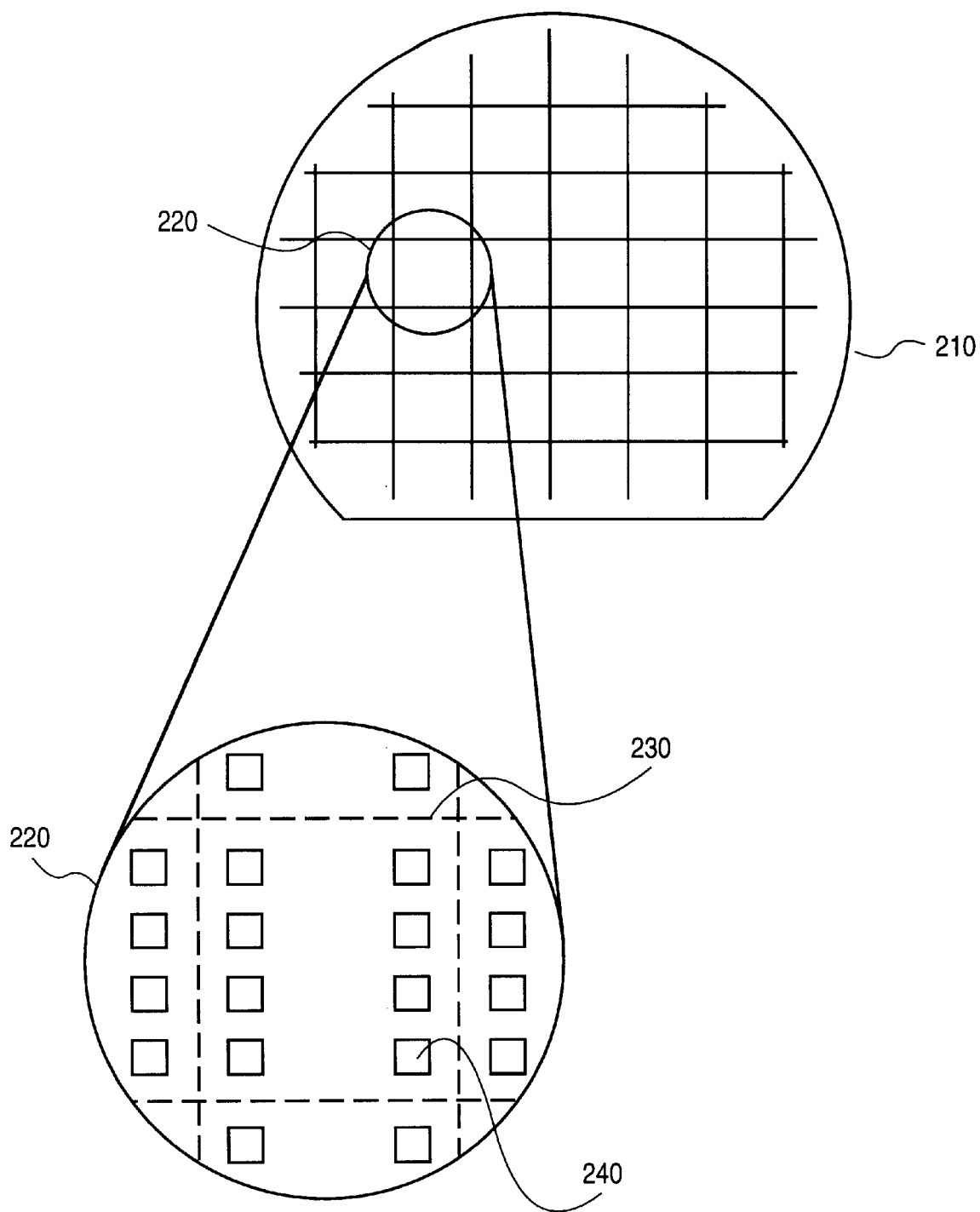
FIG. 2 illustrates a wafer on which the present invention may be implemented.

FIG. 2 illustrates a wafer with which embodiments of the present invention may be implemented. Wafer 210 is an electronic component wafer containing a fully processed electronic component. The electronic component can include an integrated circuit, an integrated passive network, or a discrete component. Wafers of various sizes may be used. One area 220 of the wafer 210 is expanded for a better image. The area 220 contains one electronic component 230, which is delineated in FIG. 2 by dashed lines. In actual implementation, no such lines are visible. The electronic component 230 contains a plurality of contact pads 240. Such contact pads are be made of a metal, such as aluminum. Further processing steps illustrate the electronic component 230 as it is processed.

FIGS. 3–13 show the processing of an electronic component. For one embodiment the processing illustrated below occurs at a wafer level prior to the separation of the wafer into individual dies. Wafer level packaging is advantageous because it permits processing to occur simultaneously for multiple dies, and does not require individual handling of the dies. Furthermore, because the dies are prepared in the same process, uniformity of processing is assured. The figures below illustrate a single die, however, it is understood that the processing is wafer level, and occurs to all dies on the wafer substantially simultaneously.

Figure 3:
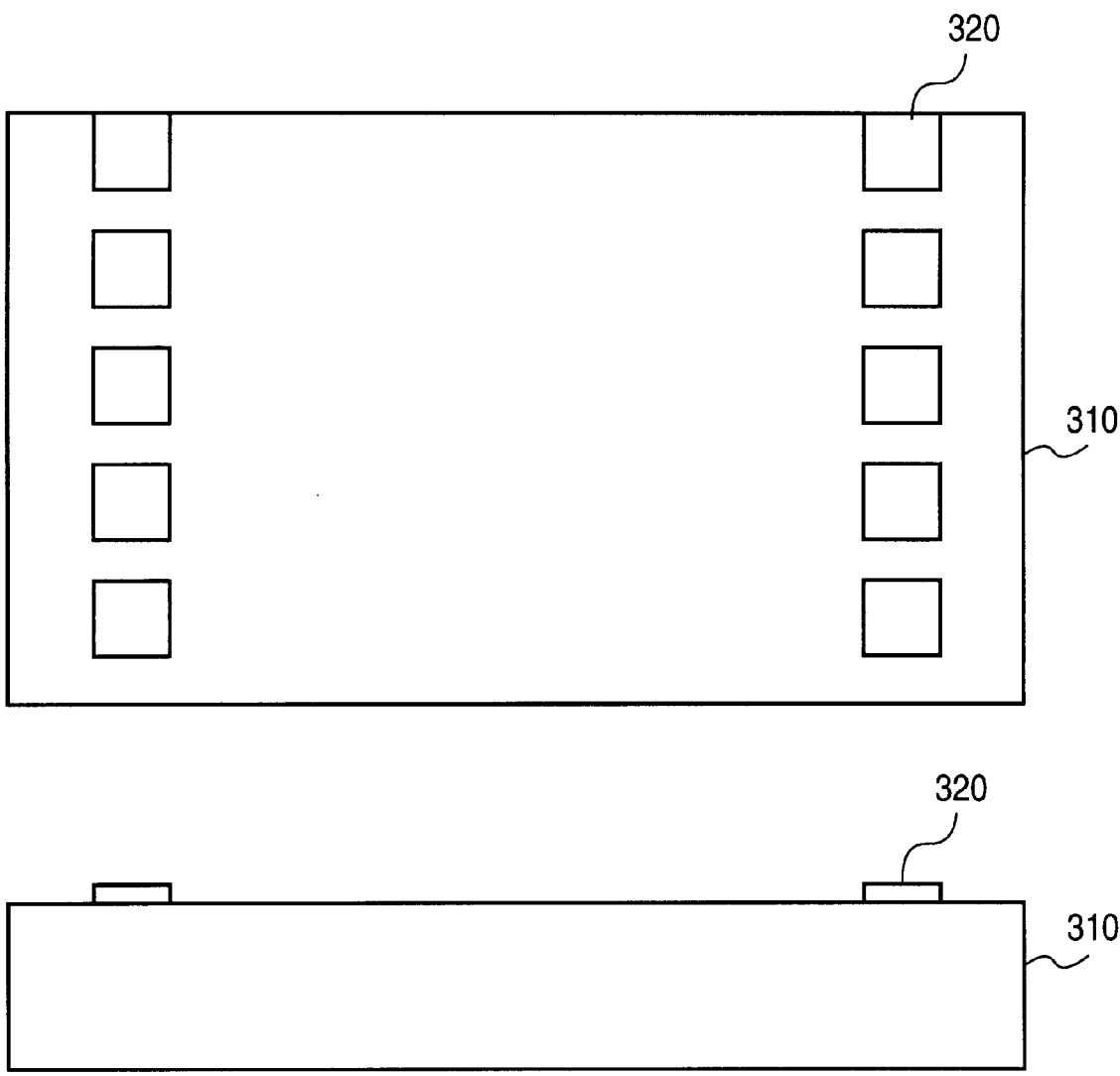
FIG. 3 illustrates a die.

FIG. 3 illustrates an electronic component die. For one embodiment, the electronic component is an integrated circuit, an electronic circuit, an active discrete electronic component, a passive discrete electronic component, or an other similar device. The die 310 is a processed electronic component with a plurality of contact points 320 on a substrate. The substrate may be silicon, gallium arsenide, silicon germanium, silicon carbide, gallium phosphide, ceramic materials, sapphire, quartz, or other substrate materials. The contact points are bonding pads, or similar sites. For one embodiment, the contact points 320 are aluminum. Alternatively the contact points 320 are be any conductive metal.

Figure 4:
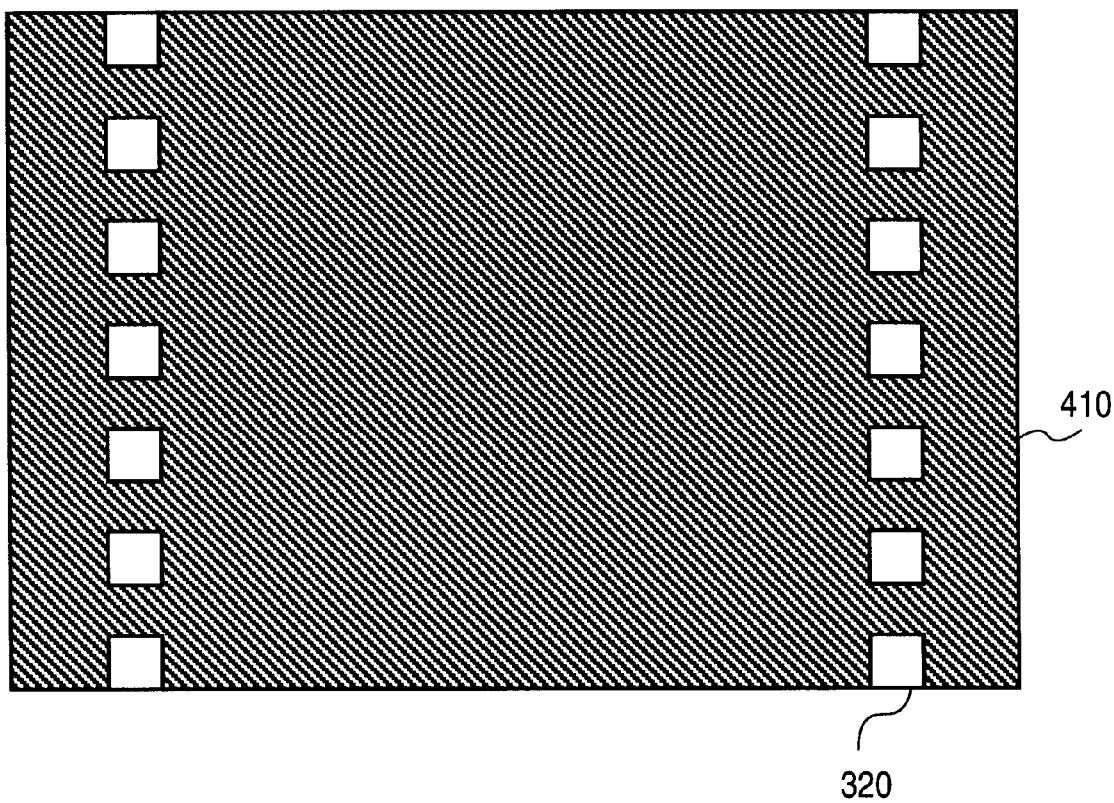
FIG. 4 illustrates the die with a first passivation layer
Figure 4:
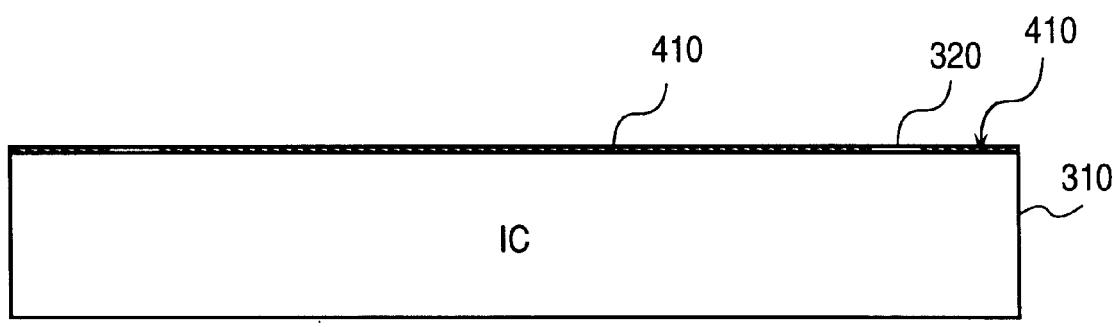

FIG. 4 illustrates a die with a first passivation layer 410. The passivation layer 410 is deposited by spinning, vapor deposition, or other known methods. For one embodiment, the passivation layer 410 is polyimide. Alternately, the passivation layer 410 is made of silicon nitride, silicon dioxide, epoxy, plastic, resin, Teflon, silicon oxide, silicon, polysilicon, amorphous silicon, aluminum, diamond, or other insulating material. The entire circuit is covered by passivation layer 410. Alternatively, the passivation layer 410 is removed from the contact points 320 by etching. Alternatively, the passivation layer 410 is deposited using masking, and which leaves the contact points 320 exposed. For one embodiment, the present packaging process starts at this point. The first passivation layer 410 is deposited during the formation of the electronic component.

Figure 5:
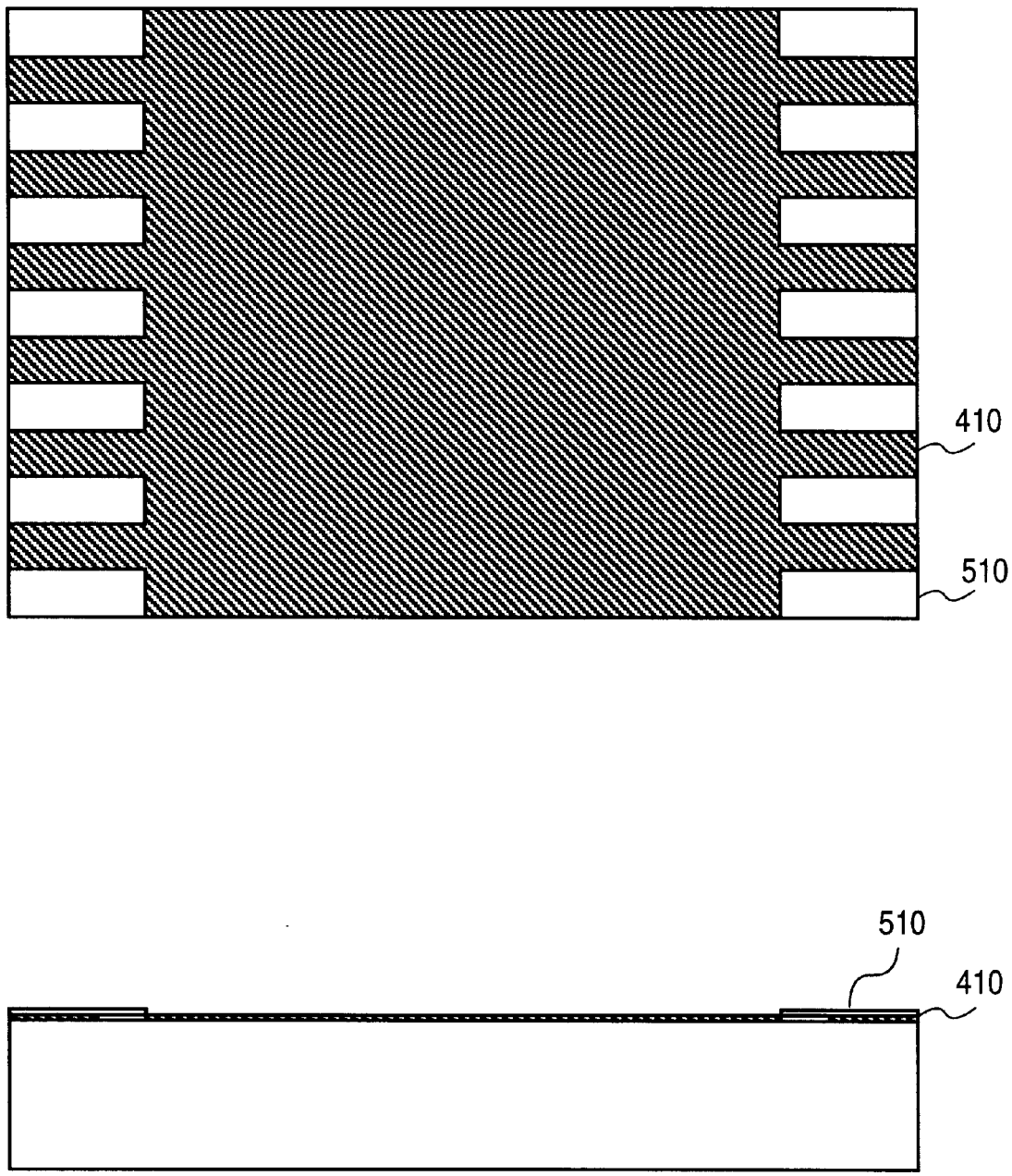
FIG. 5 illustrates the die with metal beams.

FIG. 5 illustrates a die with metal beams 510. Metal beams 510 are deposited over the passivation layer 410, and are in electrical contact with contact points 320. For one embodiment, a barrier metal such as titanium tungsten/gold (TiW/Au) is first sputter deposited over the entire circuit. The barrier metal provides a barrier layer between metals and enhances adhesion of the metal beams 510. After the deposition of the metal beams 510, the barrier metal layer is etched away from the remaining areas of the electronic component 300. The metal beams 510 are deposited in order to lead the contact points 310 to a location adjacent to the position where a post is deposited, as will be described below. If the contact points 310 are in the correct position, this step may be omitted. The metal beams 510 are made of gold, silver, nickel, titanium, aluminum, copper, platinum, or an other conductive metal. For one embodiment, the metal beams 510 extend to the edge of the electronic component. For one embodiment, metal beams 510 are 4–8 microns in thickness.

Figure 6:
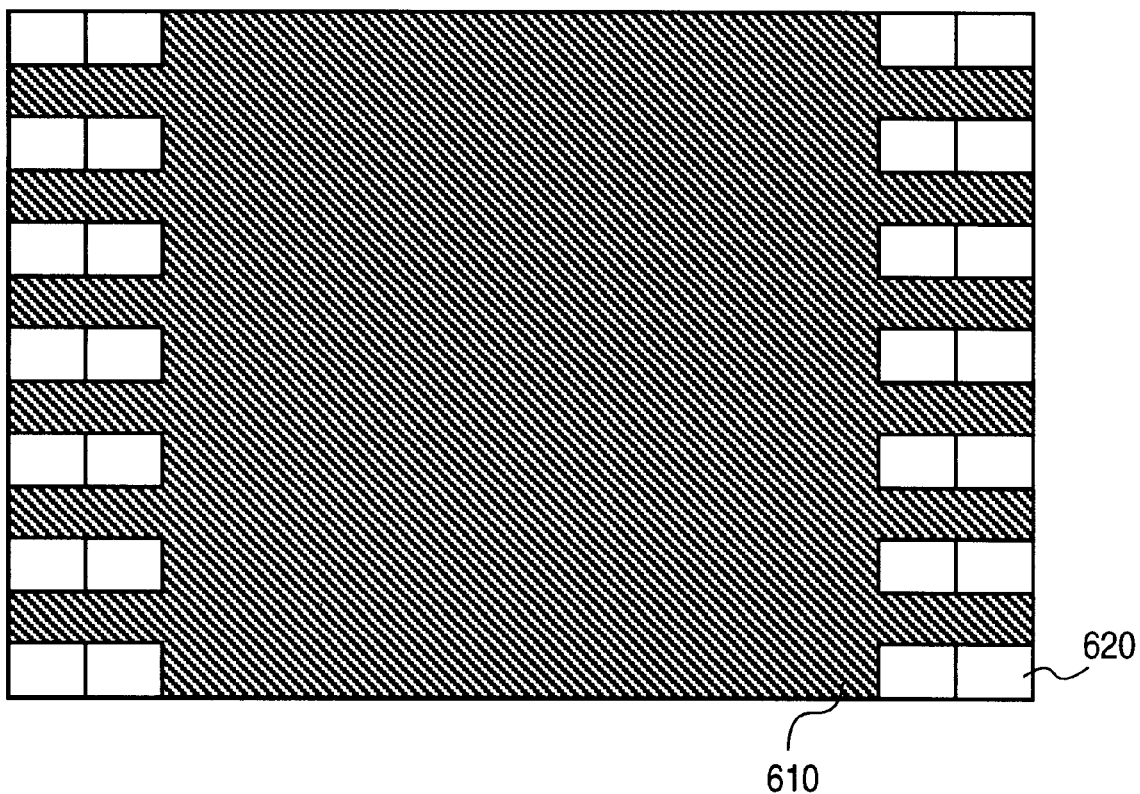
FIG. 6 illustrates the die with a second passivation layer
Figure 6:
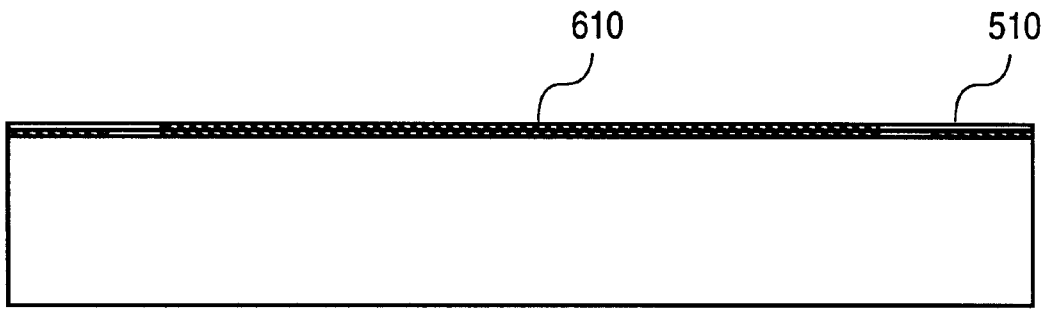

FIG. 6 illustrates a die with a second insulating layer 610. The second insulating layer 610 is deposited over the passivation layer 410 and the metal beams 510. For one embodiment, the insulating layer 610 is a polyimide layer, and is deposited by spinning. Alternately, the second insulating layer 610 may be made of any of the materials listed for the passivation layer 410. For one embodiment, the insulating layer 610 covers the entire electronic component 300. For another embodiment, the insulating layer 610 is not deposited over all of the metal beams 510. Rather, some part of the metal beams 620 remain uncovered. Alternately, insulating layer 610 is deposited over the entire electronic component and etched from part of the metal beams 620. For one embodiment a wet etch is used to etch away the insulating layer 610. Alternatively, a dry etch is used.

Figure 7:
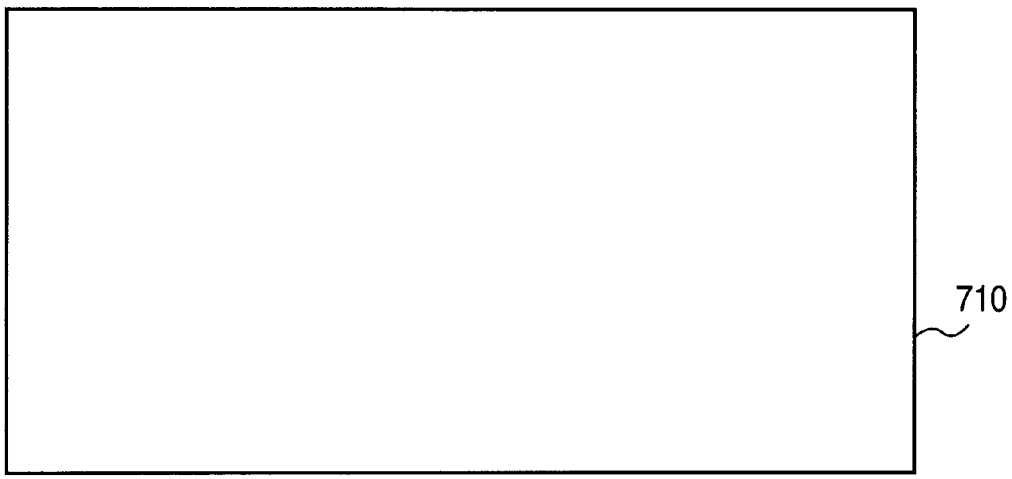
FIG. 7 illustrates the die with a cap.
Figure 7:
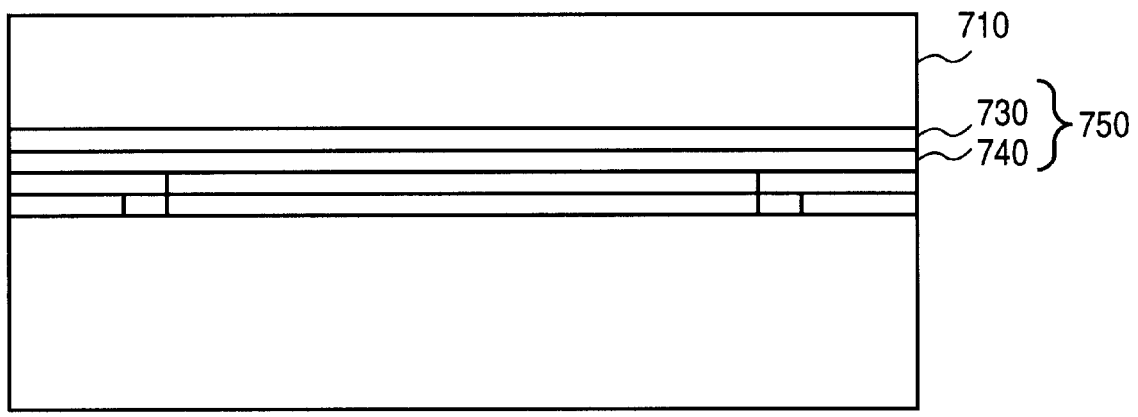

FIG. 7 illustrates the die with a cap 710. The cap 710 is attached to the electronic component 300 and covers the entire electronic component 300. For one embodiment, the electronic component is covered with an insulating layer 740, and the bottom of the cap 710 is covered with another insulating layer 730. For one embodiment, the two insulating layers 730, 740 are partially cured. Such partial curing strengthens the insulating layers 730, 740 and makes the insulating layers 730, 740 more resistant to acid etching. The partial curing is accomplished by heating, irradiating with an ultraviolet light, or similar techniques. The technique used for curing depends on the material being used for insulation. After partial curing, the cap 710 covered with insulating layer 730 is placed on top of the electronic component 300 covered with insulating layer 740, and joined together. The insulating layers 730 and 740 act as a glue, and together form the gluing layer 750. Alternatively, the cap 710 is grown or sputter deposited.

Figure 8:
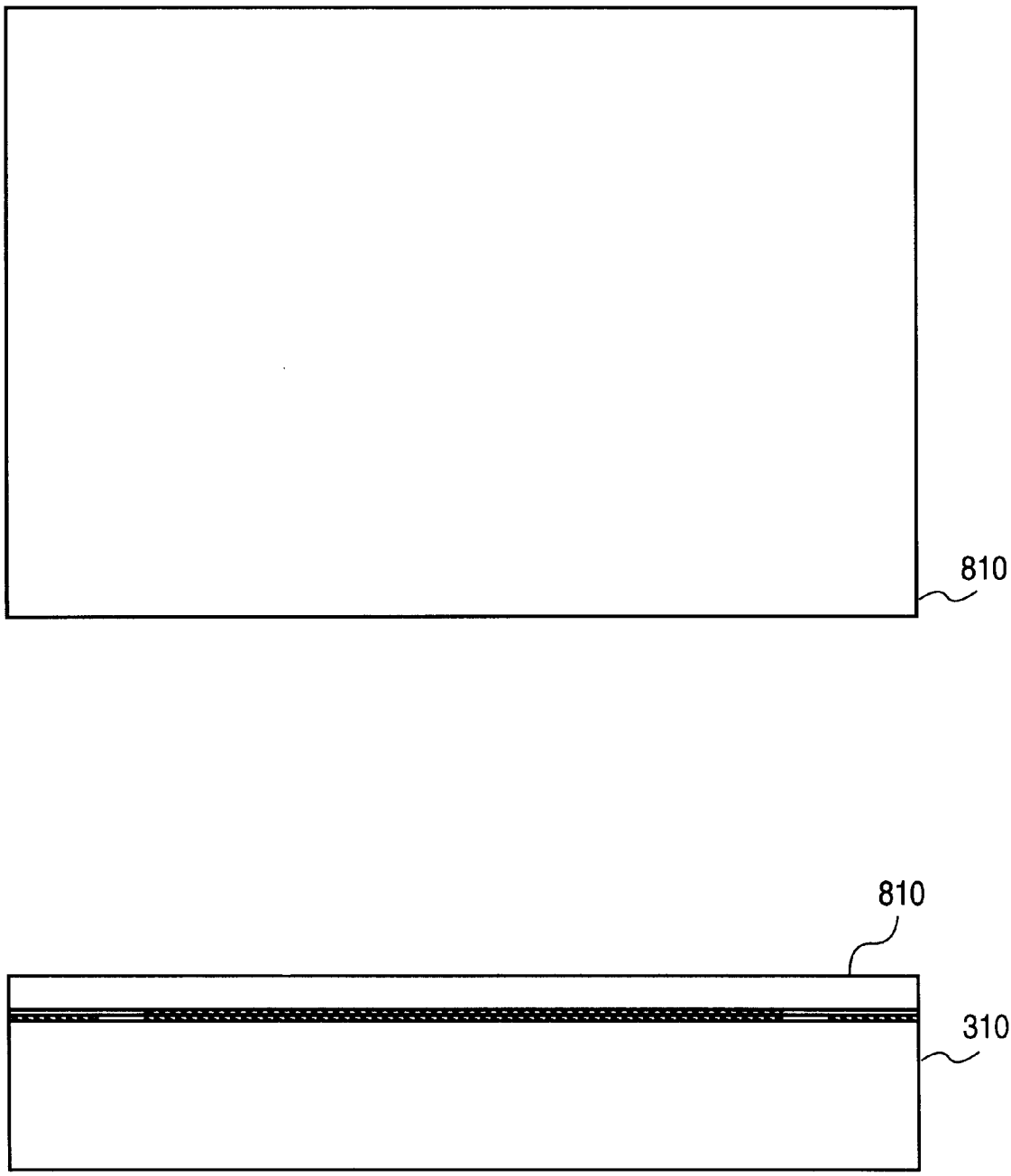
FIG. 8 illustrates the die with a thin cap.

FIG. 8 illustrates the die with a thin cap 810. The cap 710 is thinned to form a thin cap 810. For one embodiment, the cap 710 is sandblasted and etched. Alternatively, the cap 710 is thinned by grinding, etching, or other known techniques. The resulting thin cap 810 is approximately 3–15 thousandth of an inch (mil) in height, depending on compliancy and standoff required. Alternatively, the original cap 710 may be sufficiently thin not to require this step. Alternatively, this step is omitted.

Figure 9:
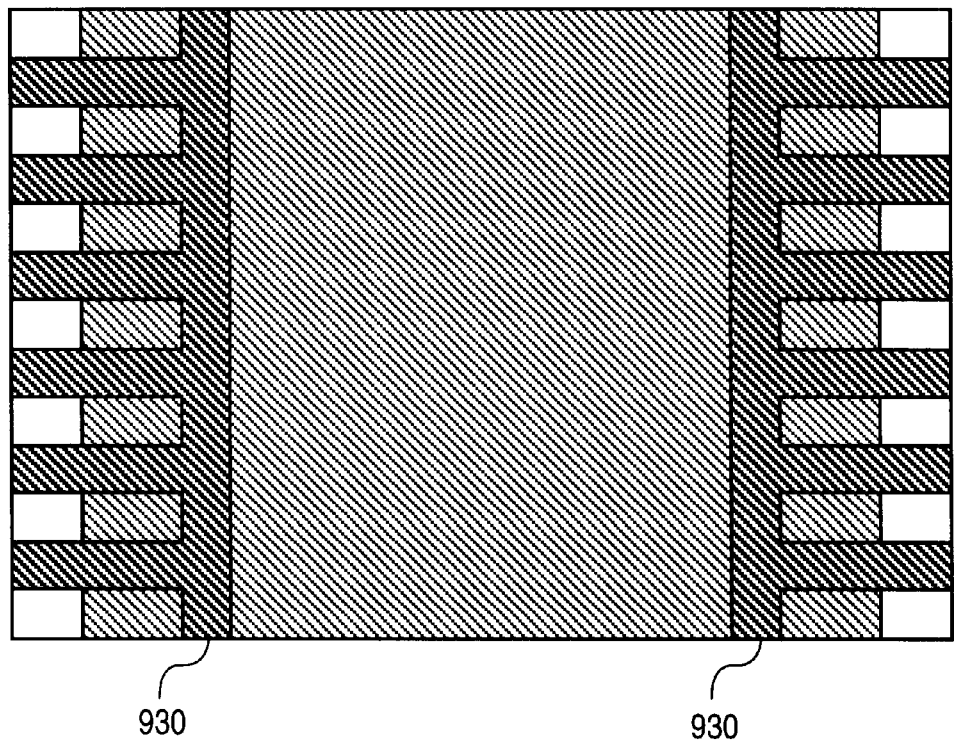
FIG. 9 illustrates the die with trenches.
Figure 9:
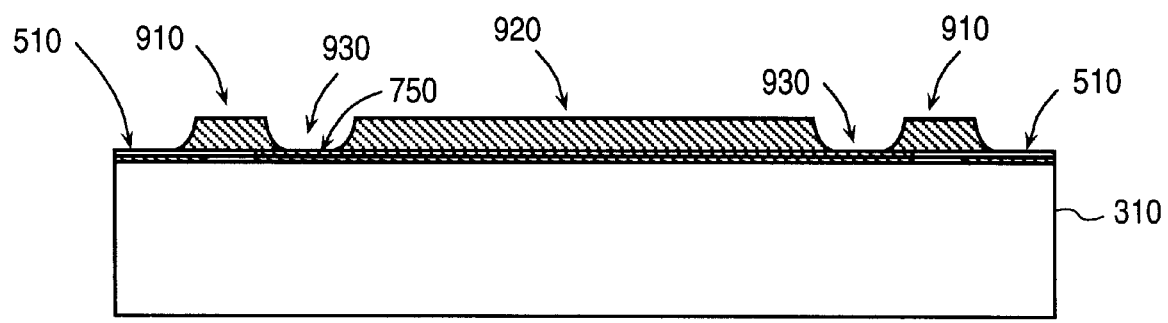

FIG. 9 illustrates the cap 810 with trenches 930. The thin cap 810 is patterned. For one embodiment, patterning is accomplished using a wet etch. The trenches 930 define posts 910 and a central area 920. The thin cap 810 is etched away at these trenches 930 to the gluing layer 750. The trenches 930 are located such that they expose the gluing layer 750 over the contact areas 310 or metal beam 510. For one embodiment, the posts 910 are approximately 4 mils by 4 mils in size at their narrowest. The size of the posts 910 is limited by the minimum working size of the equipment used, and the stability requirement of the circuit. For one embodiment the base size of posts 910 is maximized in order to assure proper adherence and stability. The trenches 930 are approximately 8 mils in width, and are etched around each of the posts 910. Thus, the remaining area of the circuit is covered by the central area 920. Alternatively, the central area 920 is etched away, leaving only posts 910. For one embodiment, posts 910 are 4–6 mils in thickness.

FIGS. 7–9 illustrate one method of forming the posts 910 used in the present invention. Alternative methods include photoforming posts 910 from an encapsulant material. Such a material would provide additional compliancy inherent in the posts 910. Alternatively, the posts 910 are a material such as plastic, metal, or other material described above with respect to the cap 710. For one embodiment, a material with compliancy is used to form the posts 910. Such posts 910 may either be formed as described above, grown, prefabricated and attached, stenciled, or made by other means known in the art. For one embodiment, the posts 910 are made of silicon, gallium arsenide, silicon germanium, silicon carbide, gallium phosphide, ceramic materials, sapphire, quartz, or other substrate materials. Alternatively, the posts 910 are made of polymer plastic, patterned plastic, epoxy, glass, Teflon, silicon dioxide, polysilicon, or any other material which can provide mechanical support for the conductive layer described below. The result is posts 910 which are positioned adjacent to metal beams 510 or contact points 320.

Figure 10:
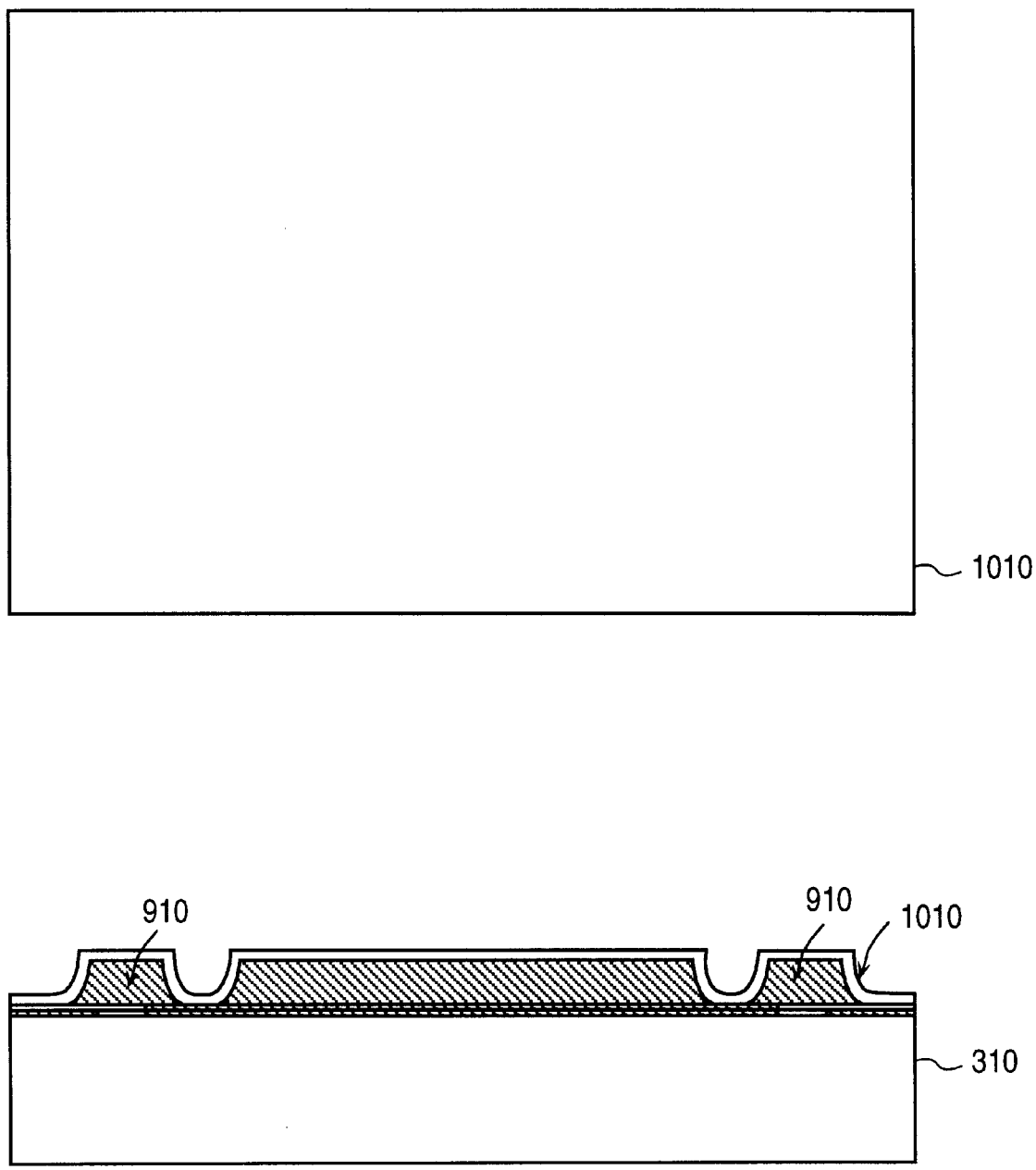
FIG. 10 illustrates the die with a third passivation layer.

FIG. 10 illustrates the die with third insulating layer 1010. The third insulating layer 1010 is deposited over the entire electronic component 300, covering the trenches. The overlaying insulating layer 1010 is for keeping the posts 910 in place and providing further compliancy. For one embodiment, third insulating layer 1010 is a polyimide layer, which is deposited by spinning. For one embodiment, this step is omitted.

Figure 11:
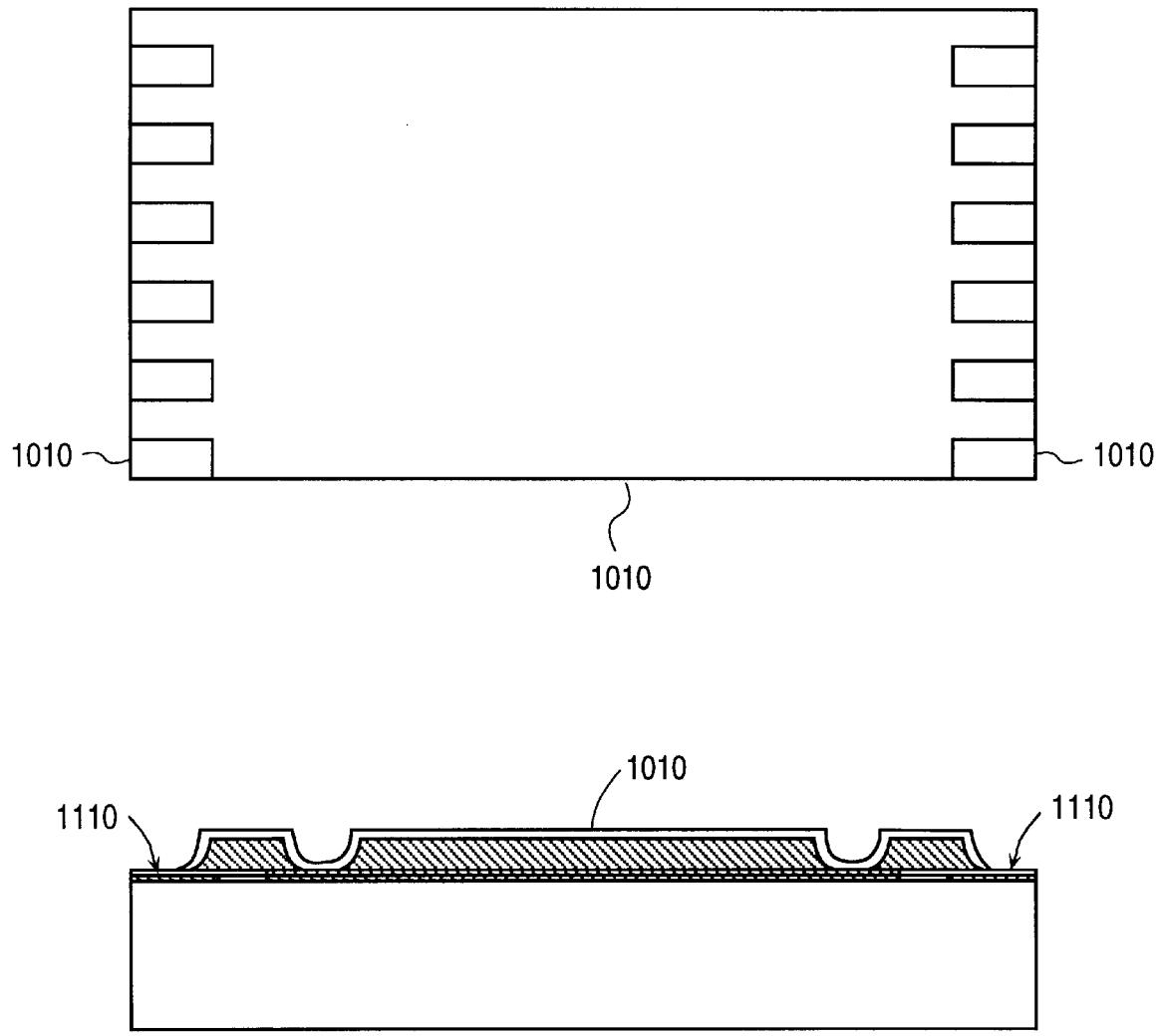
FIG. 11 illustrates the die with the layers over the contact points etched away, exposing contacts.

FIG. 11 illustrates the die with the layers over the contact points 320 removed, exposing contacts 1110. Contacts 1110 may be contact points 320 or metal beams 510. The hole is etched through the layers which may include insulating layer 1010 and the gluing layer 750, to the underlying metal. For one embodiment, this is accomplished using photo imaging to remove insulating layer 1010, and a dry etch to remove gluing layer 750.

Figure 12:
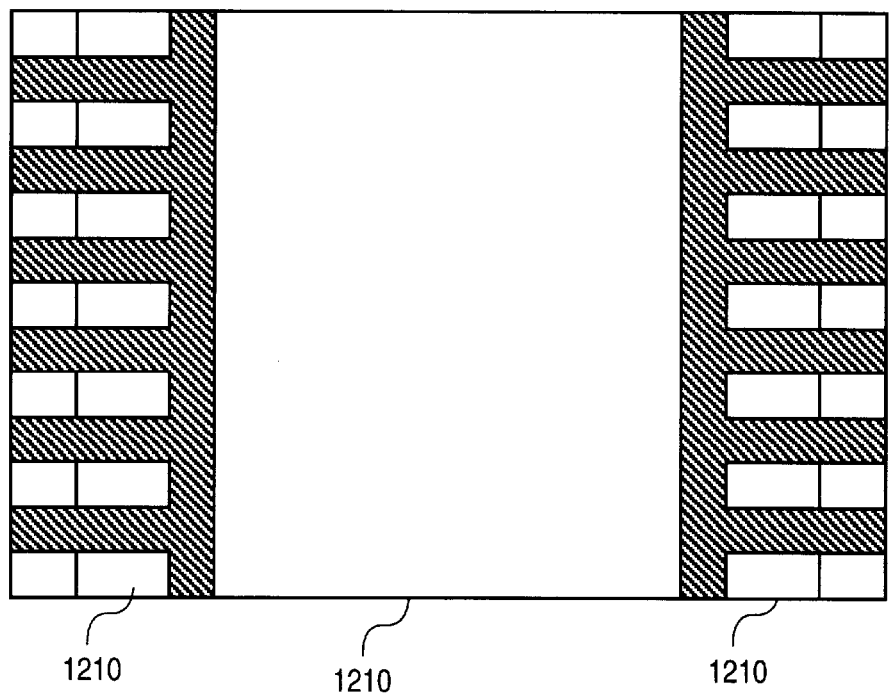
FIG. 12 illustrates the die with a conductive layer.
Figure 12:
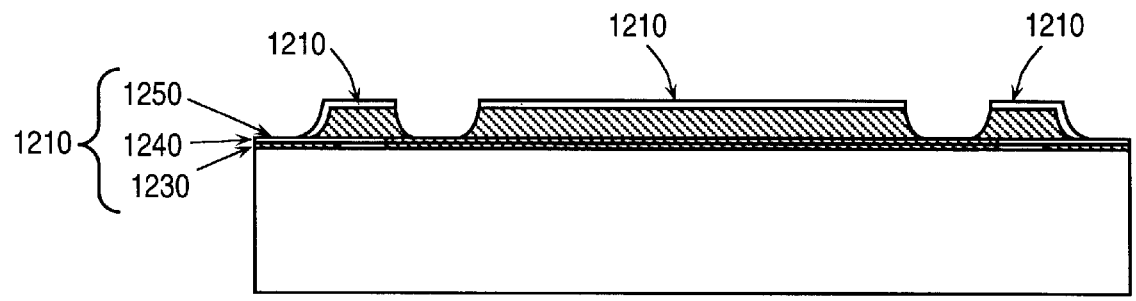

FIG. 12 illustrates the die with a conductive layer 1210. The conductive layer 1210 is deposited on the posts 910 and the exposed portions of contacts 1110. For one embodiment, prior to depositing the conductive layer 1210 a barrier metal such as titanium tungsten/gold (TiW/Au) is first sputter deposited over the entire circuit. The barrier metal provides a barrier layer between metals and enhances adhesion of the conductive layer 1210. After the deposition of conductive layer 1210, the barrier metal layer is etched away from the remaining areas of the electronic component.

For one embodiment, the conductive layer 1210 comprises a first gold layer 1230, a nickel layer 1240 and a flash gold layer 1250. For one embodiment, the nickel layer 1240 is deposited using electroless deposition, i.e. by chemical reduction. For one embodiment, the first gold layer 1230 is 4–8 microns and the nickel layer 1240 is 4–6 microns in thickness. The nickel layer 1240 is used because the gold layer 1230 should not be in contact with solder because it might affect solder joint reliability. The nickel layer 1240, however, is susceptible to oxidization. To avoid oxidization, for one embodiment, a flash gold layer 1250 is deposited over the nickel layer 1250. The conductive layer 1210 may further be deposited on the central area 920, in order to use the central area 920 as a heat sink. Alternatively, the central area 920 is covered with a different metal, such as nickel and a layer of flash gold, or left without a metal coating layer.

Figure 13:
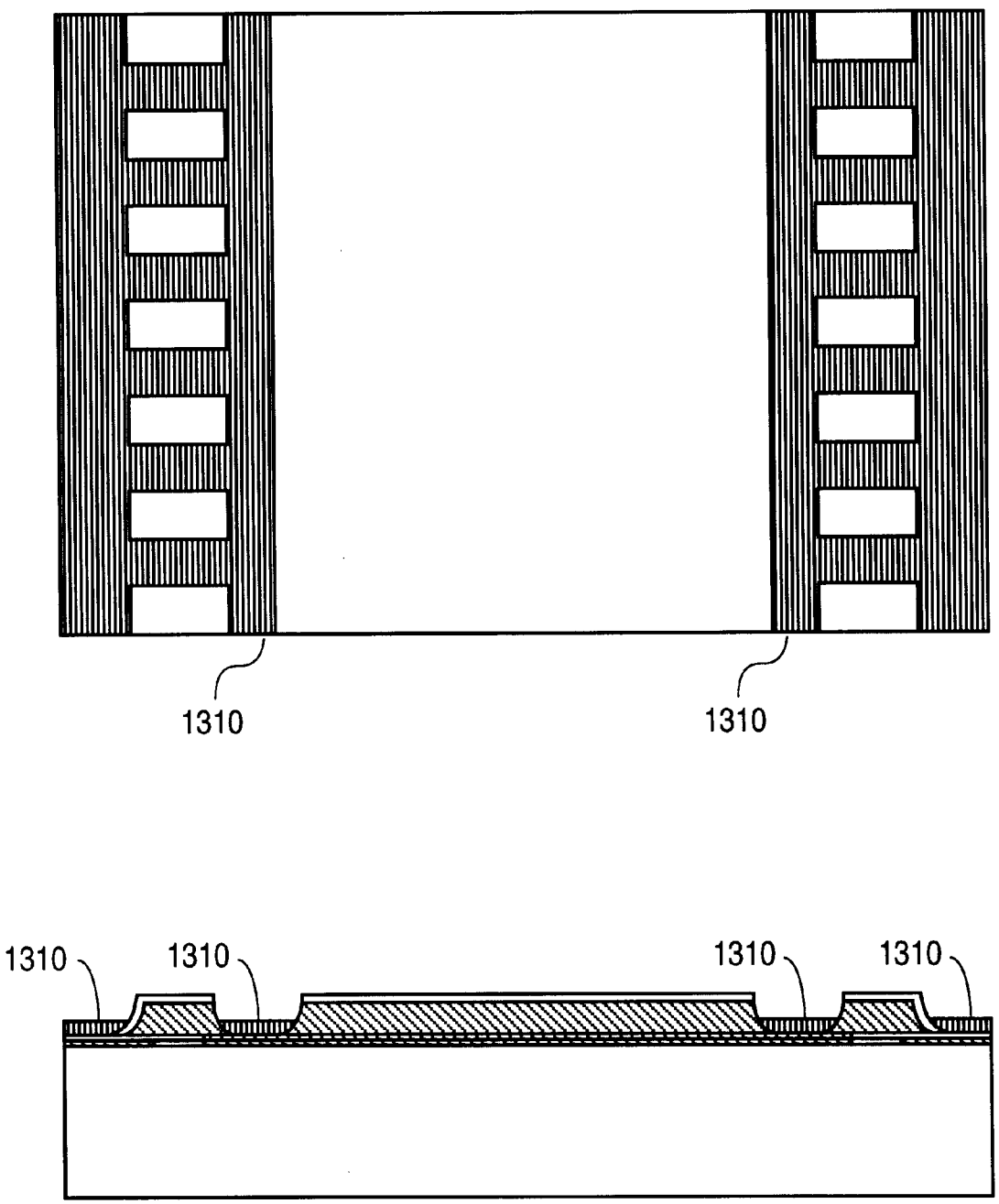
FIG. 13 illustrates the die with a coating layer.

FIG. 13 illustrates the die with a coating layer 1310. The coating layer 1310 is used to cover the metal beams 620, protect the electronic component 310, and to cover the electrically conductive areas of the circuit. For one embodiment, the coating layer 1310 is not deposited on the top of posts 910 and the top of central area 920. Thus the metallized top of the posts 910 remains electrically conductive. The coating layer 1310 is deposited using a masking process. Alternatively, the coating layer 1310 is deposited uniformly over the entire circuit, and removed from the top of posts 910 and central area 920 using photo imaging techniques. For one embodiment, the coating layer 1310 is an encapsulant, which is polyimide. Alternatively, the coating layer 1310 is an epoxy.

Figure 14:
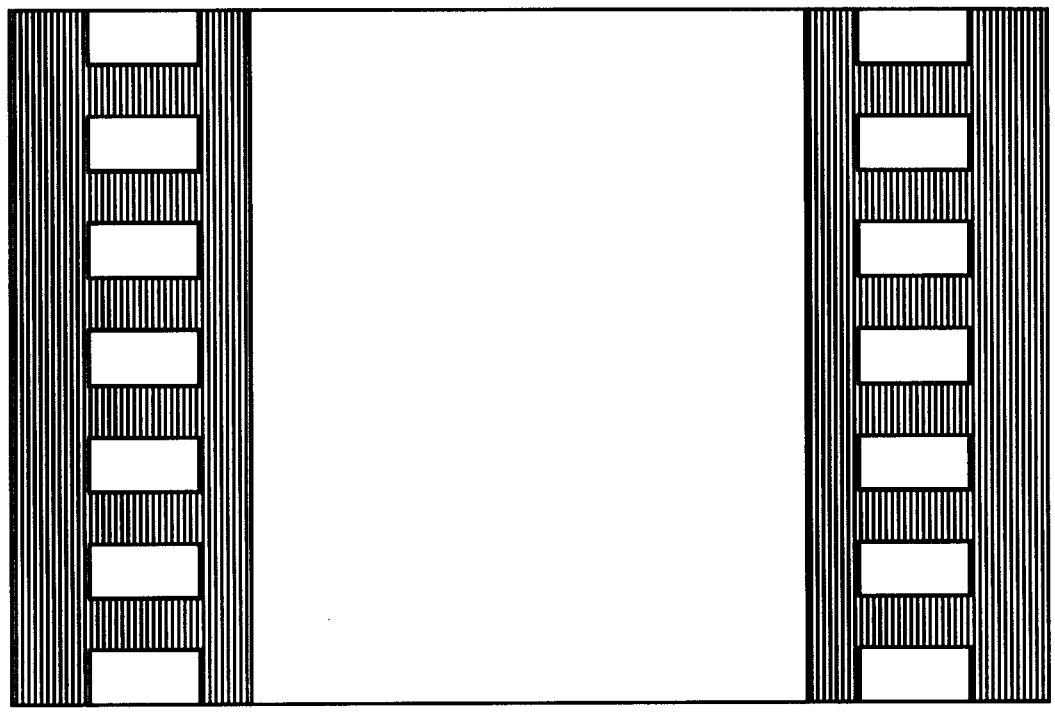
FIG. 14 illustrates the die with an encapsulant on the backside of the circuit.
Figure 14:
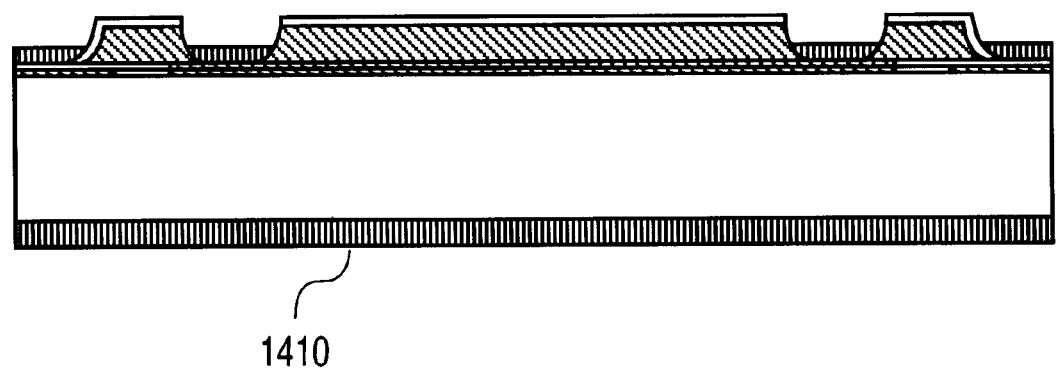

FIG. 14 illustrates the die with an encapsulant. The backside of electronic component 300 is exposed, and there is a danger that the backside of the silicon may become chipped or otherwise damaged. An encapsulant 1410 is used to prevent such an occurrence. For one embodiment, the encapsulant 1410 is epoxy. Alternatively, other materials may be used. For one embodiment, the area between the individual dies is sawed partially prior to the deposition of the encapsulant 1410. This allows the encapsulant to cover the sides as well as the backside of the electronic component.

Figure 15:
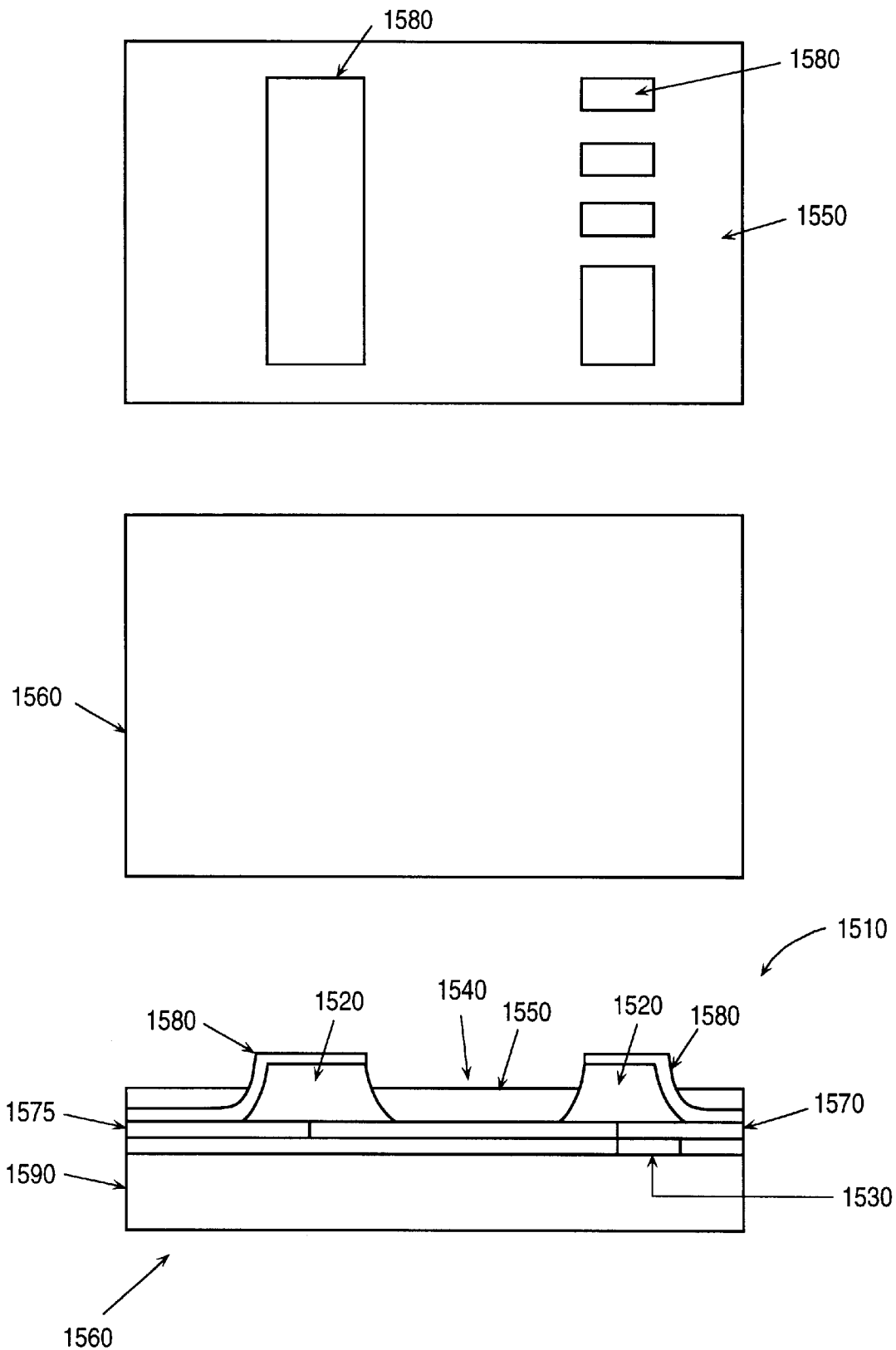
FIG. 15 illustrates a circuit with the active side of the substrate processed according to the present invention.

FIG. 15 illustrates a circuit, and part of an area adjacent to the circuit 1510. Circuit 1510 is processed according the process described above with respect to FIGS. 3–14. The top view 1510 shows the conductive layer 1580 over posts 1520. The trenches 1540 between the posts 1520 are coated with an encapsulant 1550 which holds posts 1520 in place, and protects the conductive areas from accidental short circuits. The conductive layer 1580 on posts 1520 is in contact with metal beam 1570, which is in electrical contact with contact area 1530 on the surface of the electronic component. There may also be metal beams 1575 which are not in contact with any contact areas 1530 on the electronic component. For one embodiment, metal beams 1570, 1575 extend beyond the end of circuit 1510 by approximately 3–12 mil. For one embodiment, there is approximately 10 mil between each circuit on the wafer. In these 10 mil, there are no underlying active areas. The back side 1560 of the semiconductor substrate is thin. For one embodiment, the back side 1560 of the semiconductor substrate is thinned to 3–10 mils. Generally, a semiconductor substrate 1590 is relatively thick but only has active components on or near the surface. The thickness of the substrate 1590 simplifies processing. The semiconductor substrate 1590 is thinned by sandblasting, grinding, etching, or other known techniques. The etched back side 1560 of semiconductor 1590 is a relatively flat semiconductor surface.

Figure 16:
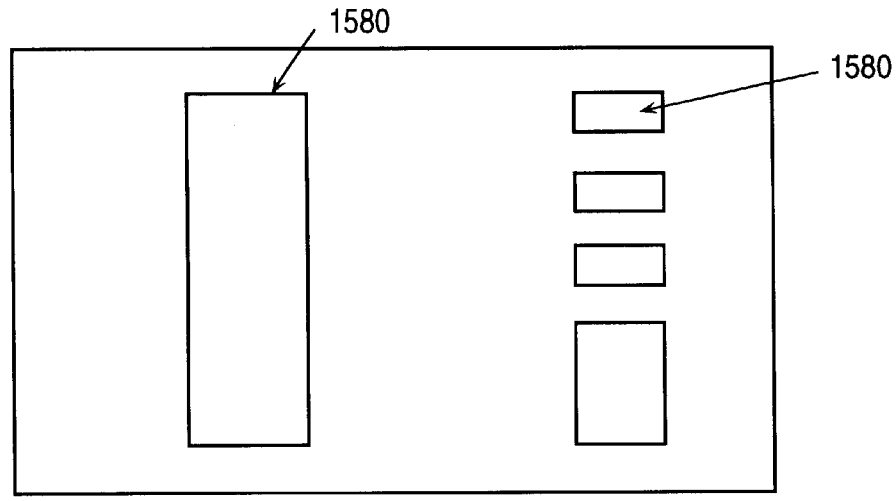
FIG. 16 illustrates the circuit of FIG. 15 with a trench on the back side.
Figure 16:
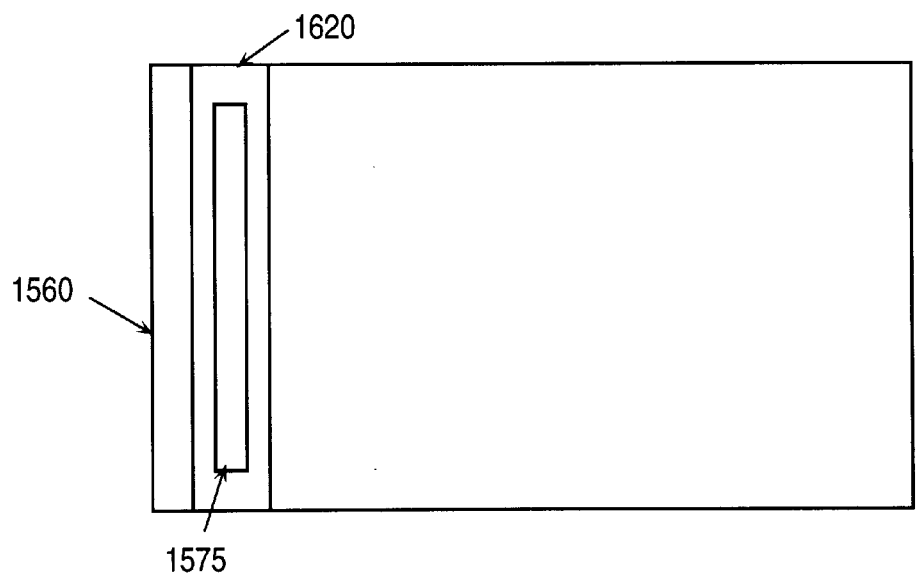
Figure 16:
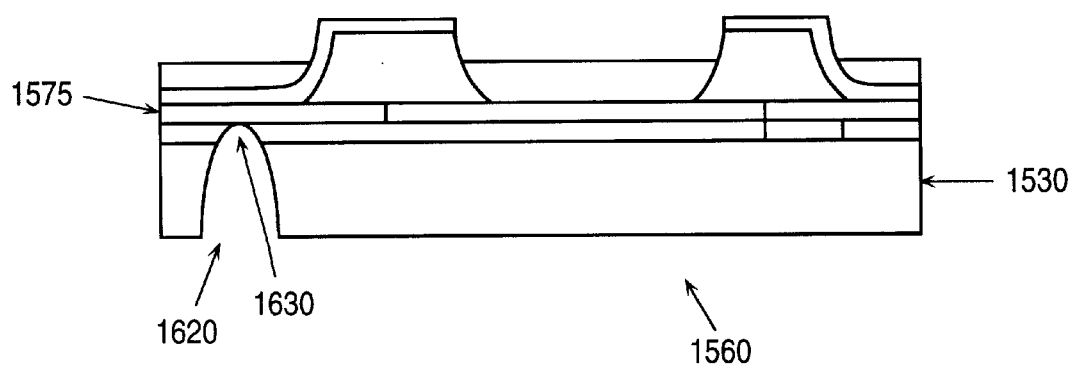

FIG. 16 illustrates the circuit of FIG. 15 with a trench 1620. The trench is placed between the electronic components, substantially under a metal beam 1575. The metal beam 1575 which is over the trench 1620 is not in electrical contact with any contact areas 1530. For one embodiment, the trench 1620 is created in a two step process. First, a saw blade is used to saw down almost to the metal beam 1575. For one embodiment, the saw blade is 2 or 4 mil blade. Then, this sawed out portion is further etched, to extend the trench 1620 to the metal beam 1575. The etch, which is a wet etch, widens and deepens the trench 1620. For one embodiment, the trench 1620 is approximately 3–8 mil in width, and the bottom 1630 of the trench 1620 is approximately 1–3 mils from the end of the post 1520. For one embodiment, the step of sawing out is skipped if the etch used is sufficiently precise to form trench 1620. The sawing out makes the etch more precise and directed.

Figure 17:
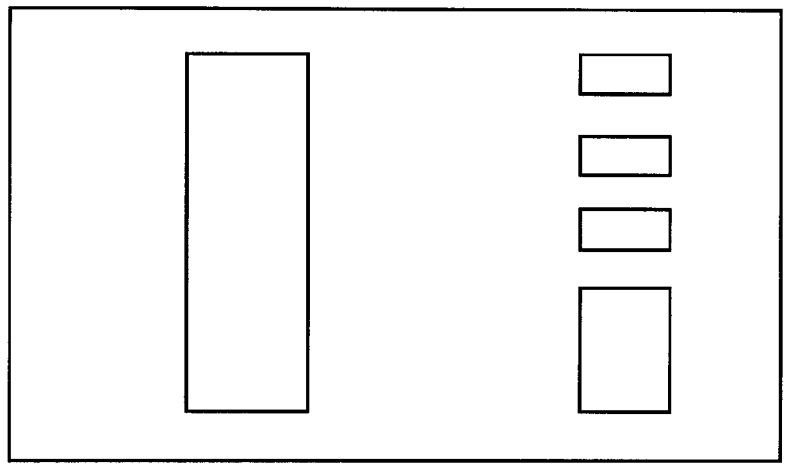
FIG. 17 illustrates the circuit of FIG. 16 with a metal layer deposited over the back side of the circuit.
Figure 17:
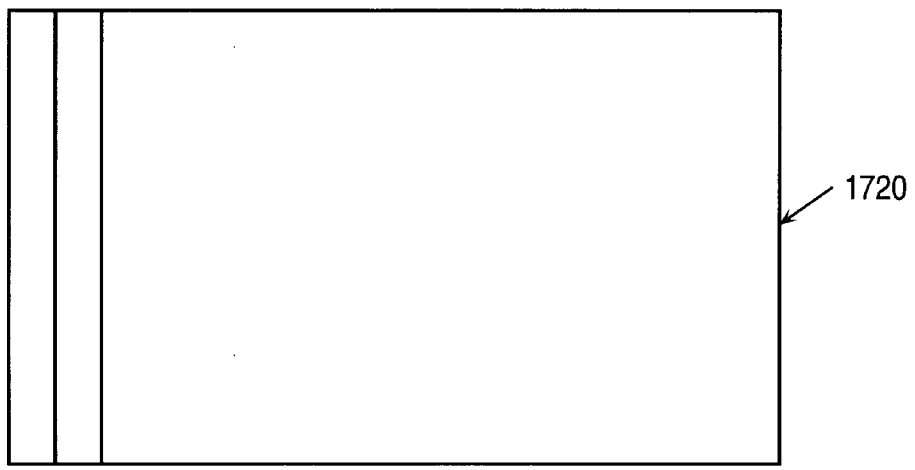
Figure 17:
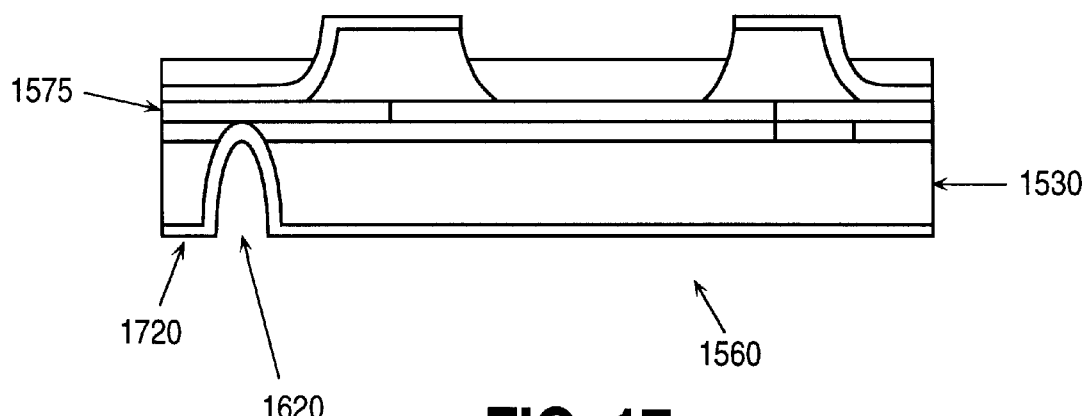

FIG. 17 illustrates the circuit of FIG. 16 with a metal layer 1720 deposited over the bottom 1630 of the circuit. For one embodiment, the metal layer 1720 covers the entire back side 1560 of the circuit. Alternatively, metal layer 1720 may cover only part of the back side 1560 of the circuit. The metal layer 1720 is in electrical contact with at least one metal beam 1575. For one embodiment, metal layer 1720 only contacts some of the metal beams 1570, 1575. Specifically, only those metal beams 1575 which act as ground are electrically coupled to the metal layer 1720. Additionally, the metal layer 1720 may act as a drain in circuits which use a drain. Metal layer 1720 may further act as a heat sink. For one embodiment, metal layer 1720 is a plated nickel layer. For one embodiment, the metal layer 1720 is further covered with a flash gold layer, to prevent oxidization.

Figure 18:
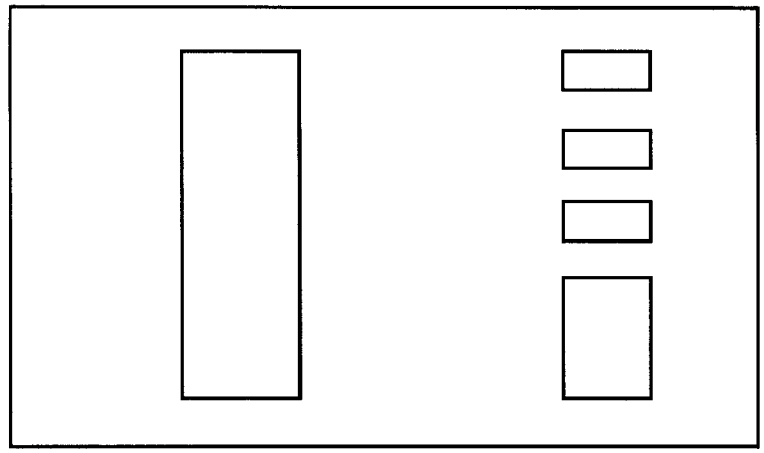
FIG. 18 illustrates the circuit of FIG. 17 with an encapsulant covering the back side of the circuit.
Figure 18:
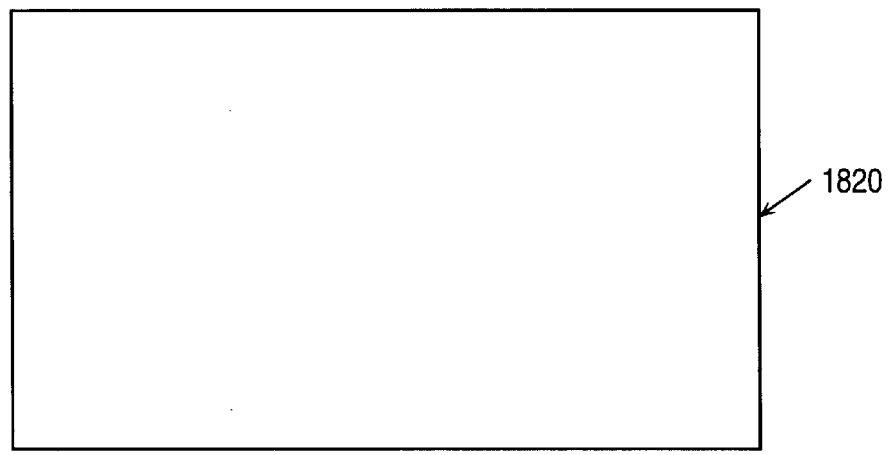
Figure 18:
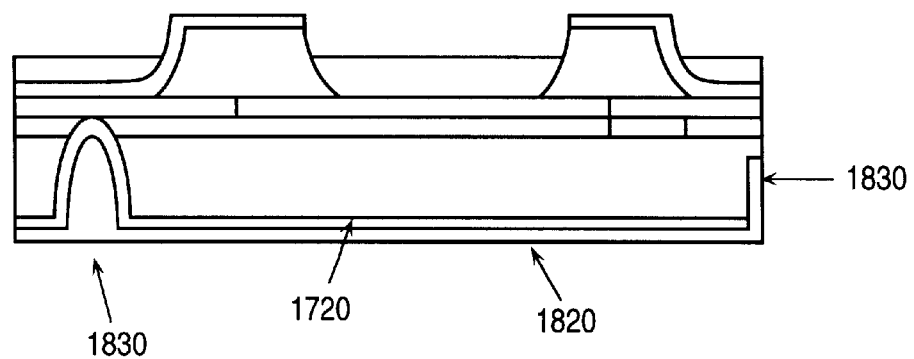

FIG. 18 illustrates the circuit of FIG. 17 with an encapsulant 1820 covering the back side 1560 of the circuit. For one embodiment, encapsulant 1820 is an epoxy. For one embodiment, prior to the deposition of encapsulant 1820 a thick blade is used to saw the side of the circuit without the trench. The thick saw blade, for one embodiment, a 6 mil blade, creates a slot 1830 which is then covered with encapsulant 1820. The encapsulant 1820 covers the back side 1560 and part of the sides of the electronic component, protecting it from the environment and further processing. Encapsulant 1820 also covers trench 1620 and slot 1830, such that back side 1560 of the circuit is substantially flat. This simplifies further handing of the circuit, and makes it more robust.

For one embodiment the processing illustrated in FIGS. 15–18 may accomplished prior to the forming the posts on the active side of the substrate. In this way, the danger of damaging the posts or the conductive layer on the posts are minimized. For simplicity's sake, in this example, the active side and back side processes were separated.

Figure 19:
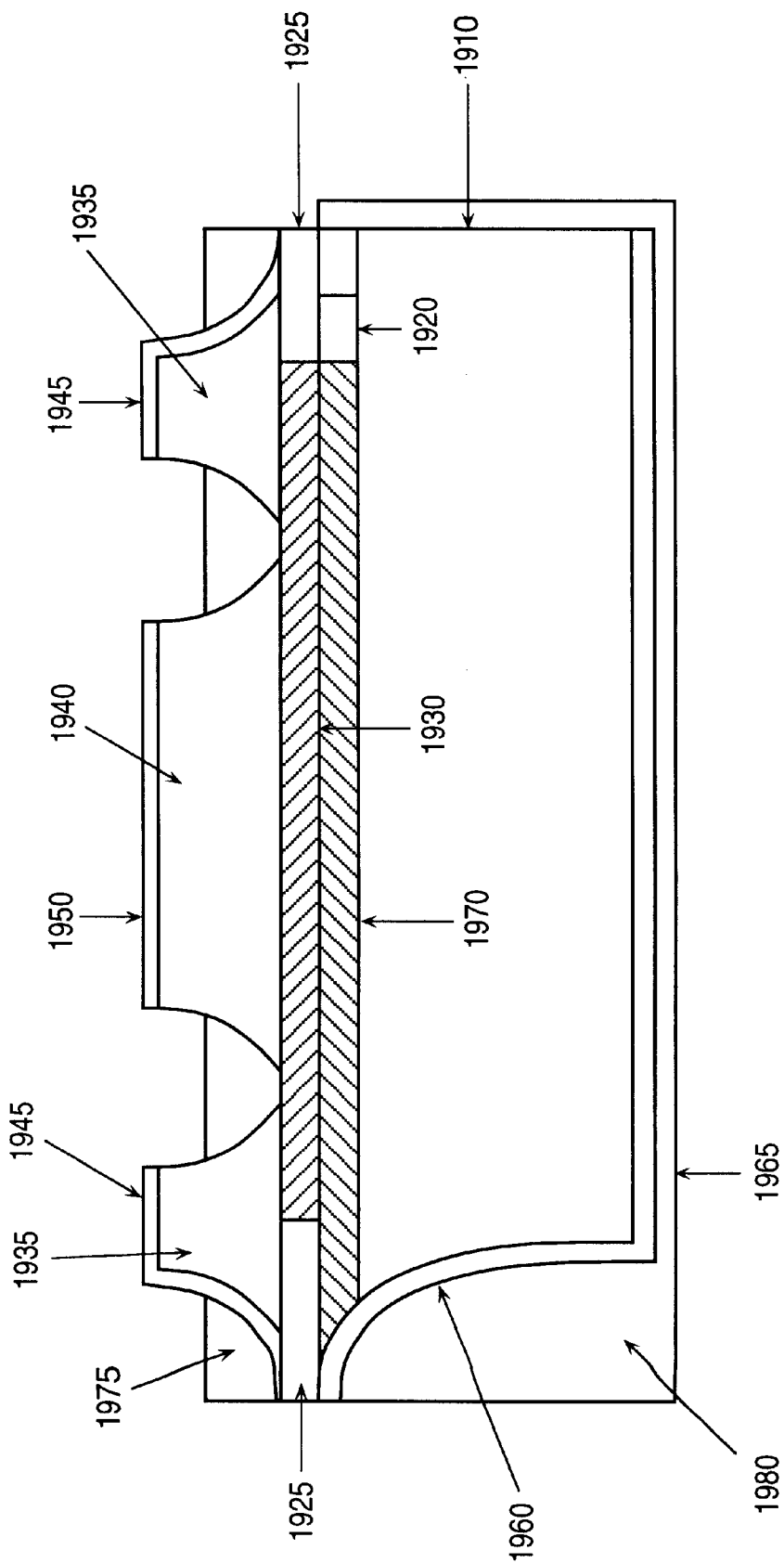
FIG. 19 illustrates one embodiment of completed die processed according to the present invention.

FIG. 19 illustrates one embodiment of a die processed according to the present invention. Substrate 1910 includes an electronic component with a plurality of contacts 1920. The areas between the contacts 1920 are covered with a passivation layer 1970. Metal beams 1925 overlay the contacts 1920, and extend beyond the contacts 1920. Metal beams 1925 may further be placed in locations where drains are needed, but there are no underlying contacts 1920. For one embodiment, metal beams 1925 are made of gold. For one embodiment, metal beams 1925 extend to the edge of the substrate 1910.

The areas between the metal beams 1925 are covered with an insulating layer 1930. For one embodiment, insulating layer 1930 is polyimide.

Posts 1935 overlay the insulating layer 1930, and may partially overlay metal beams 1925. Posts 1935 are formed by etching a cap glued to the active side of the substrate of the electronic component. Alternatively, posts 1935 are formed from encapsulant, by stenciling on the material of the posts 1935. Alternatively, posts 1935 are formed in a separate process and attached to the electronic component. Alternately, photolithography, masking, or other known techniques are used to deposit posts 1935.

The posts 1935 are covered with a conductive layer 1945, which is gold. The conductive layer 1945 is in electrical contact with the metal beams 1925. Thus, the conductive layer 1945, which is disposed on top of the posts 1935 is in electrical contact with the contacts 1920 of the electronic component.

Center portion 1940 is processed at the same time as the posts 1935. The top of central portion 1940 is covered with a metal layer 1950, which may act as a heat sink, conducting heat away from the substrate 1910. For one embodiment, metal layer 1950 is the same material and deposited in the same processing cycle as conductive layer 1945.

The areas between the posts 1935 and center portion 1940 are covered with an encapsulant 1975 such as polyimide, in order to insulate metal beams 1925, and hold posts 1935 in place.

The back side of substrate 1910 is etched to form a trench 1980. The trench 1980 extends to the back side of metal beam 1925, exposing metal beam 1925. The backside conductive layer 1960 covers the backside of substrate 1910, including the sides of trench 1980. The backside layer 1960 is in electrical contact with at least some of metal beams 1925, which are not in contact with contacts 1920. Back-end layer 1960 acts as a drain and/or heat sink, if needed.

The back side of the die, now electrically conductive, is covered by an encapsulant 1965 in order to isolate and protect it. For one embodiment, the encapsulant 1965 is applied by stenciling and is an epoxy. The encapsulant 1965 is designed to protect the metallized backside of the die. The encapsulant 1965 further covers at least part of the side of the die. Encapsulant 1965 further covers trench 1960, making back side of circuit substantially flat.

Figure 20:
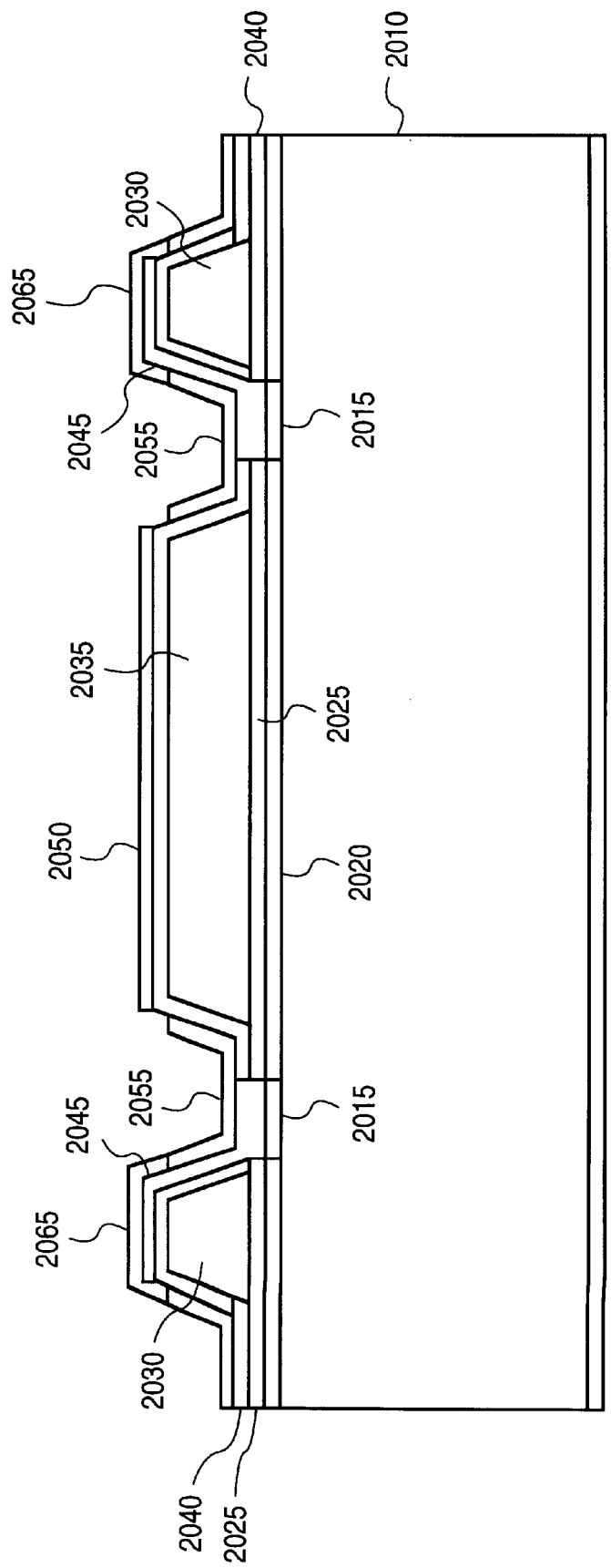
FIG. 20 is an alternative embodiment of a completed die processed according to the present invention.

FIG. 20 is an alternative embodiment of a completed die processed with the present process. The substrate 2010 is an electronic component. The contact areas 2015 of the electronic component are exposed on the face of the die. A passivation layer 2020 covers the areas between the contacts 2015. A gluing layer 2025 attaches the posts 2030 and central area 2035 to the substrate 2010. Neither the posts 2030 nor the central area 2035 cover the contact areas 2015 entirely. For one embodiment, the gluing layer 2025 is epoxy.

An overlaying insulating layer 2040 overlays circuit, including the posts 2030 and central area 2035. The posts 2030 are of different size, the size of each post 2030 corresponding to the use of the post 2030. The overlaying insulating layer 2040 does not cover the contact areas 2015. This overlaying insulating layer 2040 provides compliancy for the circuit, reducing the force exerted on the circuit as a result of the expansion and contraction of the printed circuit board on which the circuit is eventually fastened. A conductive layer 2045 is deposited over the contact areas 2015 and the side and top of the posts 2030, over the overlaying insulating layer 2040. The conductive layer 2045 is in electrical contact with the contact areas 2015. For one embodiment, the conductive layer 2045 is a first barrier layer of titanium tungsten and gold and a second layer of gold.

The top of the central area 2035 may further be coated with a second conductive layer 2050 which may be the same as the first conductive layer 2045. A conformal coating layer 2055 is deposited over the face of the circuit, leaving the conductive layer 2045 on top of posts 2030, and the conductive layer 2050 on top of the central area 2035 exposed. The coating layer 2055 protects the contact area 2015 and conductive layer 2045, and helps fix the posts 2030 in place. The areas of conductive layer 2045 which remains exposed may be covered with a contacting layer 2065. The contacting layer 2065 is for contacting solder and traces on a printed circuit board, when the circuit is attached to the printed circuit board.

The back side of the circuit is protected by an encapsulant 2060. The encapsulant 2060 protects the back side of the circuit from damage.

The present packaging invention is used for a variety of purposes. It is used to package conventional electronic components. Some special applications which take advantage of the structure of the packaging invention are described below.

Figure 21:
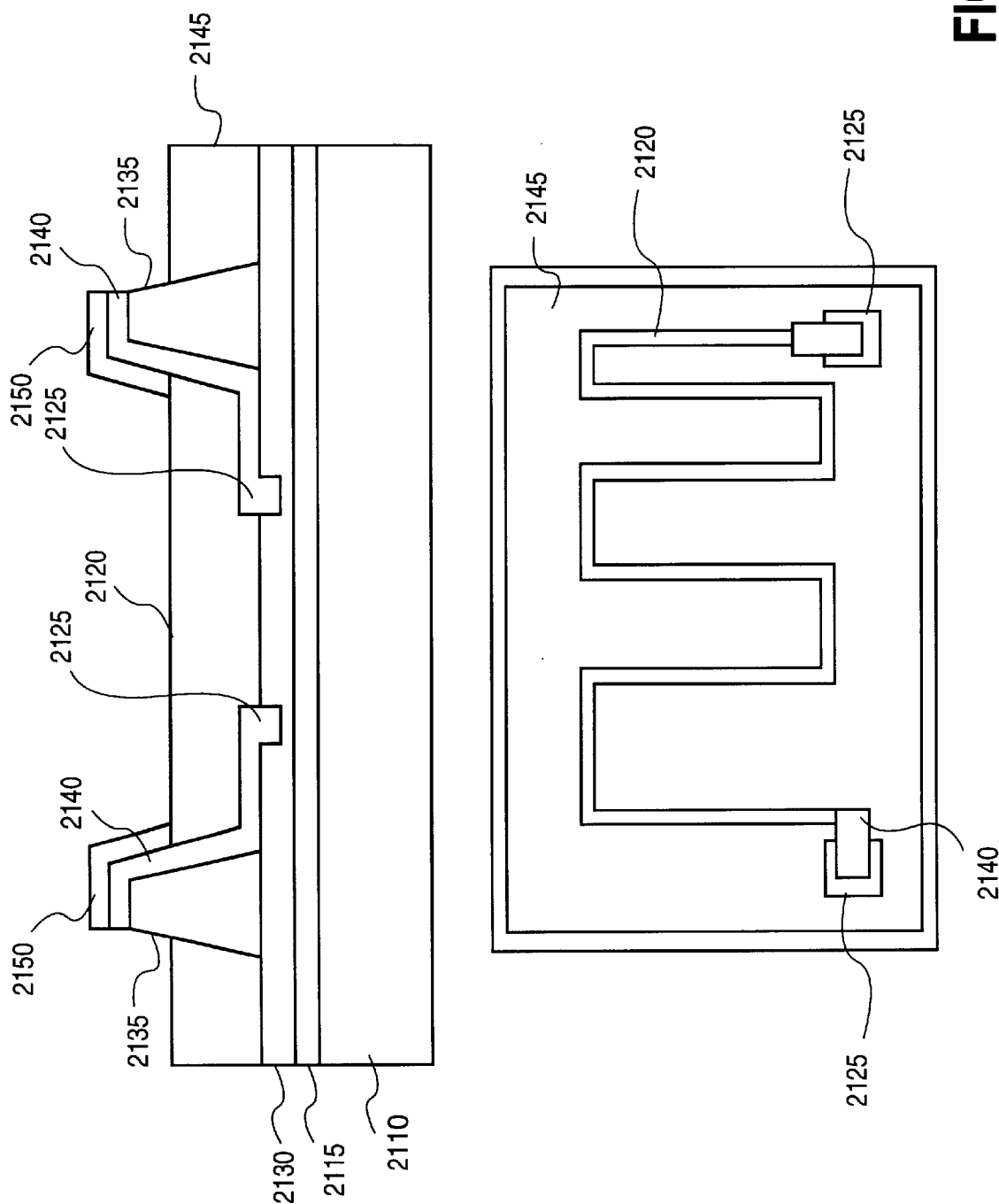
FIG. 21 illustrates a resistor implemented on a substrate according to the present invention.

FIG. 21 illustrates a resistor implemented on a substrate according to the present invention. A substrate 2110 is silicon, or any other known substrate material. A passivation layer 2115 is deposited over the substrate. The passivation layer 2115 is the insulating layer described with respect to FIG. 5.

A thin film 2120 is deposited over the passivation layer. The thin film 2120 is deposited in a narrow line, having a length corresponding to the preferred resistance value of the resistor. For one embodiment, the thin film 2120 is deposited in a rectangular shape. The shape of the thin film 2120 is designed to minimize induction, and is varied. The thin film 2120 acts as the resistor. For one embodiment, thin film 2120 is tantalum nitride. Alternatively, thin film 2120 is nichrome, tin oxide, or another known thin film material.

Contact areas 2125 are located over the thin film 2120. Contact areas 2125 are designated locations on the thin film, to which conductive layer 2140 is coupled. For one embodiment, the contact areas 2125 are on either end of the thin film 2120. A passivation layer 2130 covers the first passivation layer 2115, leaving the contact areas exposed. Posts 2135 overlay the passivation layer 2115. Posts 2135 are made of silicon, metal, plastic, or any other material which structurally can support the conductive layer 2140. The conductive layer 2140 overlays the posts 2135, and is in electrical contact with the contact areas 2125. The conductive layer 2140 is gold, or gold and nickel layers. The area between the posts 2135 is covered with a fixing passivation layer 2145, for one embodiment an encapsulant such as polyimide. The fixing passivation layer 2145 is for keeping the posts 2135 in place and electrically isolating the contact areas 2125 and conductive layer 2140 on the side of the posts 2135. The conductive layer 2140 is further covered, in the contact areas, by a contact layer 2150 such as nickel covered by a layer of gold flash. The contact layer 2150 is in contact with a printed circuit board. Thus, the resistor, formed by a thin film 2120 is packaged and formed in a single process. This process does not require the wire bonding and forming of aluminum contacts usually required in forming a resistor on a substrate.

Figure 22:
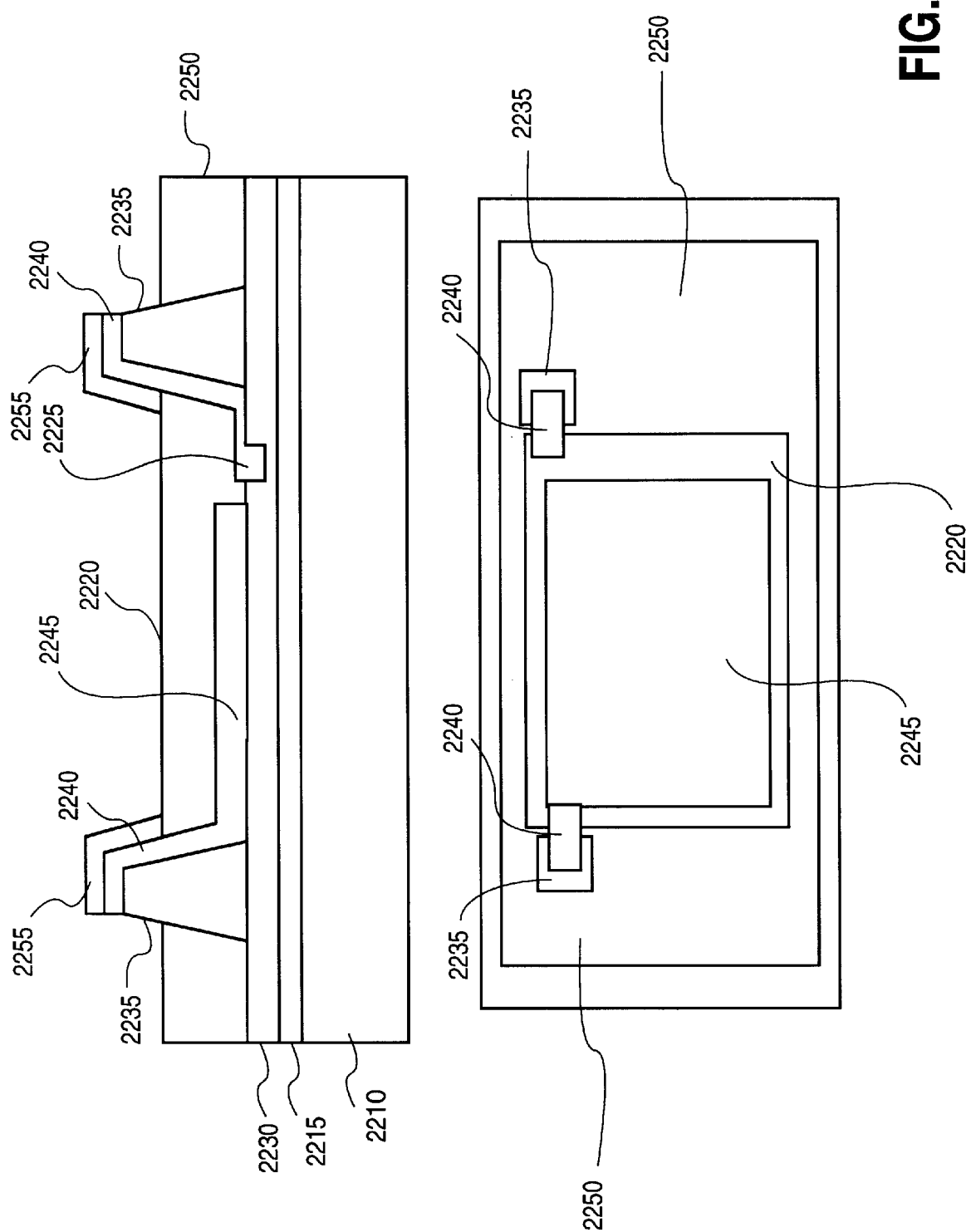
FIG. 22 illustrates a capacitor implemented on a substrate according to the present invention.

FIG. 22 illustrates a capacitor implemented on a substrate 2210 according to the present invention. A passivation layer 2215 is deposited on a substrate 2210. The substrate 2210 may contain other electronic components. The capacitor of the present invention is not deposited over any contact areas which are part of the electronic component. A thin film 2220 is deposited over the passivation layer 2215. The thin film 2220 is one of the plates which form a capacitor. A contact area 2225 is designated on the thin film 2220. An insulating layer 2230 overlays he metal layer 2220 and passivation layer 2215, but leaves the contact area 2225 exposed. The insulating layer 2230 acts as a dielectric for the capacitor.

Posts 2235 overlay the insulating layer 2230. The posts 2235 are designed to support a conductive layer 2240 which overlays the posts 2235. On one side, the conductive layer 2240 extends from the post 2235 forming an extended conductive layer 2245. The extended conductive layer 2245 is substantially parallel to the thin film 2220, and extends above the insulating layer 2230. On the other side, the conductive layer 2240 goes from the post 2235 to the designated contact area 2225 on thin film 2220. The extended conductive layer 2245 forms the second plate of the capacitor. The thin film 2220, insulating layer 2230 and extended conductive layer 2245 together form the capacitor. The area between the posts 2235 is covered with a fixing passivation layer 2250, which is an encapsulant, such as polyimide. The fixing passivation layer 2250 is for keeping the posts 2235 in place. A contact layer 2255 may further be deposited on the conductive layer 2240 on top of posts 2235. The contact layer 2255 is designed to protect the conductive layer 2240. The contact layer 2250 which is at the top of the posts 2235 are placed in contact with a printed circuit board.

Figure 23:
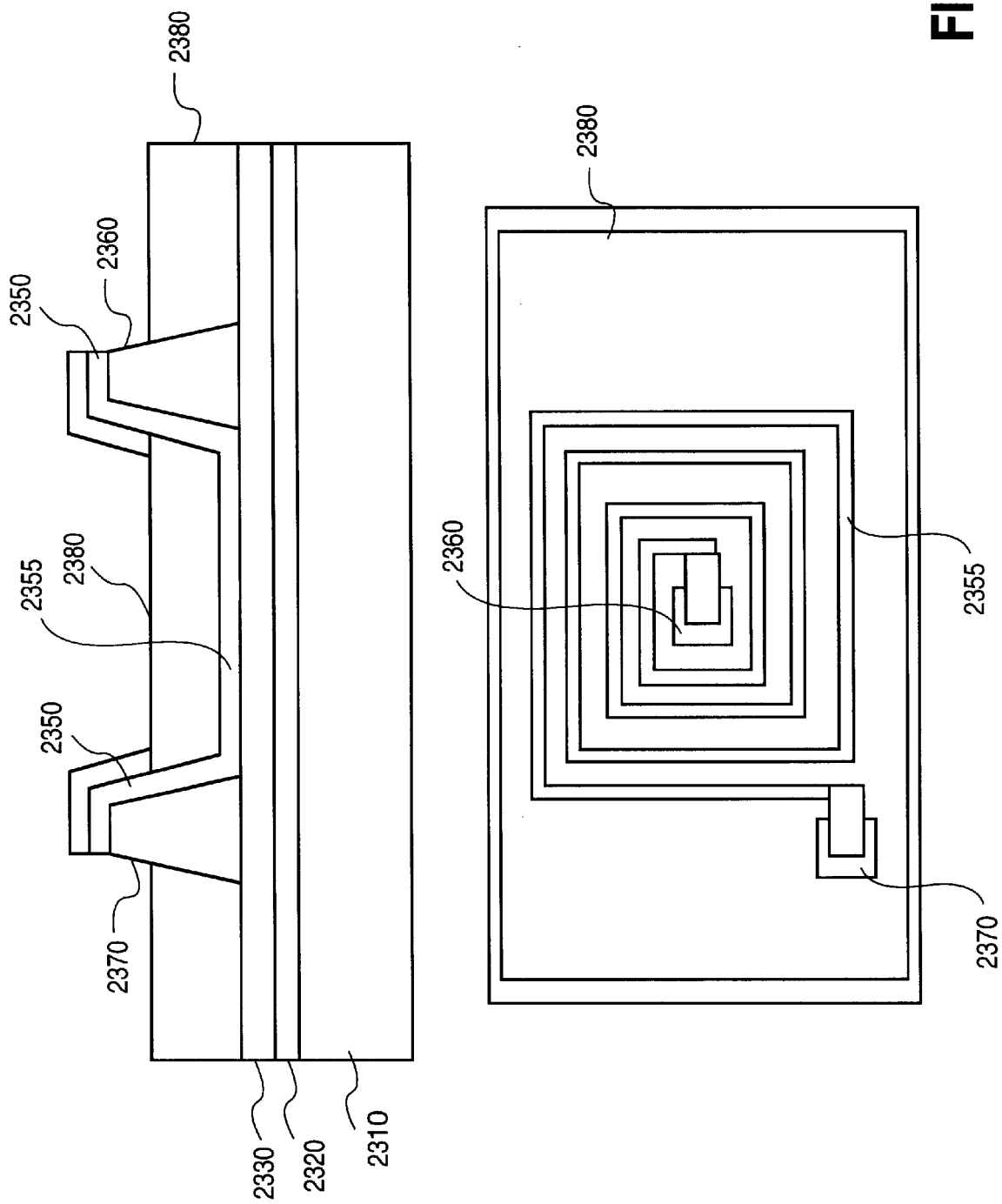
FIG. 23 illustrates an inductor implemented on a substrate according to the present invention.

FIG. 23 illustrates an inductor implemented on a substrate according to the present invention. A passivation layer 2320 is deposited over a substrate 2310. An insulating layer 2330 is deposited over the passivation layer 2320. An inside post 2360 and an outside post 2370 overlay the insulating layer 2330. A conductive layer 2350 is deposited over the top of the posts 2360, 2370. The conductive layer 2350 is further deposited as a patterned conductive layer 2355 on the insulating layer 2330. For one embodiment, patterned conductive layer 2355 is deposited on a spiral pattern, extending from a central post 2360 to an outside post 2370. The spiral pattern induces inductance in the patterned conductive layer 2355. Thus, the shape of the pattern of the patterned conductive layer 2355 is designed to have the inductance required. The area between the posts 2360, 2370 is covered with a fixing passivation layer 2380, which is an encapsulant such as polyimide. The fixing passivation layer 2380 is for keeping the posts 2360, 2370 in place and isolating the patterned conductive layer 2355 and conductive layer 2350 on the sides of posts 2360, 2370. A contact layer 2390 may further be deposited on the conductive layer 2380 on top of posts 2360, 2370. The contact layer 2390 is designed to protect the conductive layer 2380. The contact layer 2390 which is at the top of the posts 2235 are placed in contact with a printed circuit board.

Figure 24:
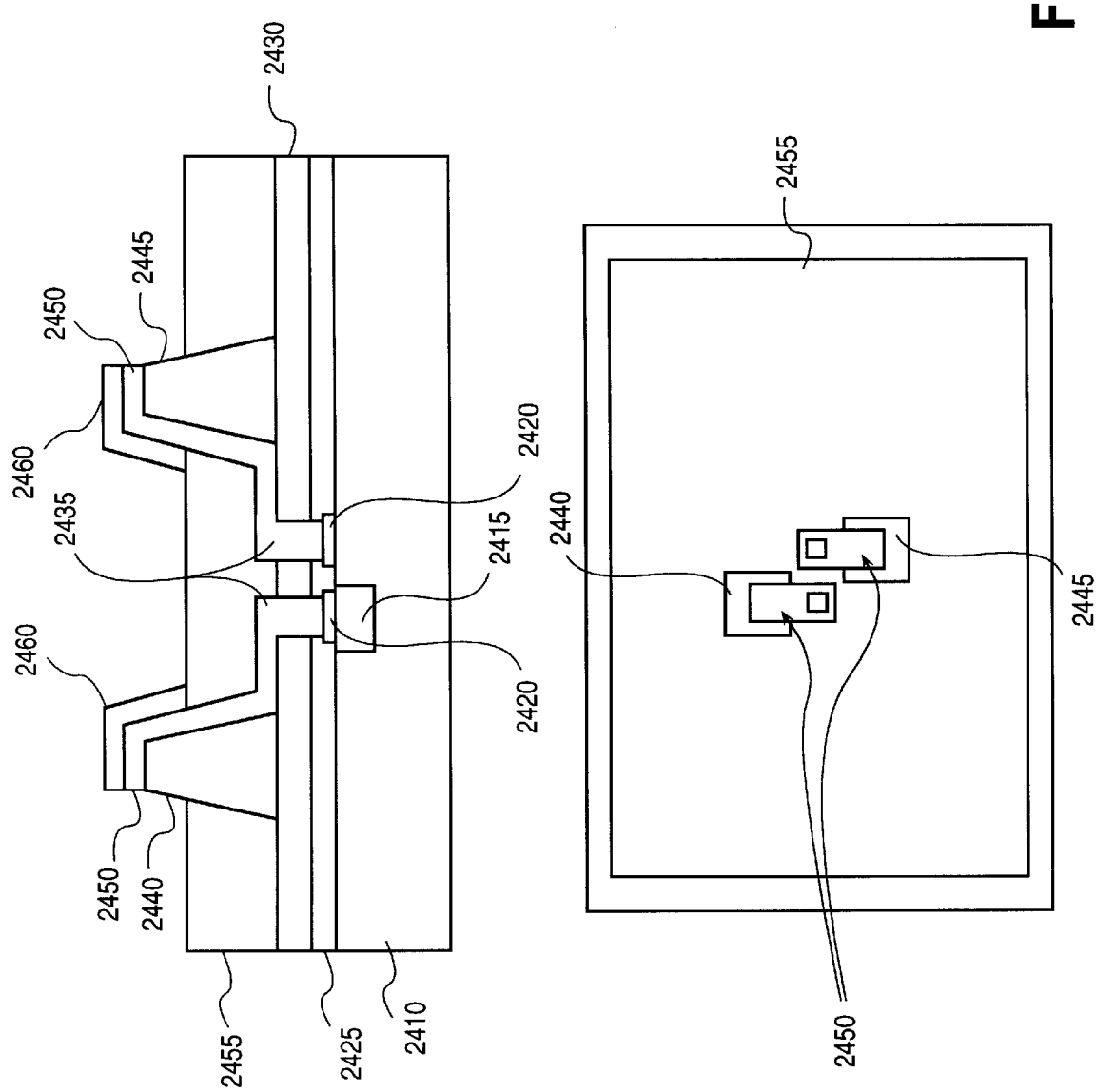
FIG. 24 illustrates a diode implemented on a substrate according to the present invention.

FIG. 24 illustrates a diode implemented on a substrate according to the present invention. The substrate 2410 has a PN junction 2415 embedded in it. The PN junction 2415 is created using conventional processes. A contact area 2420 is defined. One of the contact areas 2420 is in contact with the PN junction 2415. An passivation layer 2425 is deposited over the circuit, leaving the contact areas 2420 exposed. An insulating layer 2430 is deposited over the circuit, leaving the contact areas 2420 exposed. Alternatively, both insulating layer 2430 and passivation layer 2425 is etched to expose contact areas 2420.

A cathode post 2445 and an anode post 2440 overlay the insulating layer 2430. A conductive layer 2450 is deposited over the posts 2440, 2450. The conductive layer 2450 extends to the contact areas 2420. The conductive layer 2450 also extends to the top of posts 2440, 2445. The area between the posts 2440, 2445 is covered with a fixing passivation layer 2455, which is an encapsulant such as polyimide. The fixing passivation layer 2455 is for keeping the posts 2440, 2445 in place. A contact layer 2460 may further be deposited on the conductive layer 2450 on top of posts 2440, 2445. The contact layer 2460 is designed to protect the conductive layer 2450. The contact layer 2460 is placed in contact with a printed circuit board.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of making an electronic component package of an electronic component having a plurality of contact areas on an active side of a substrate, the method comprising the steps of:

forming a plurality of posts on the active side of the substrate;

depositing a conductive layer electrically coupling each one of the plurality of contact areas with its respective one of the plurality of posts, thereby forming a packaged electronic component, the conductive layer further for contacting traces on a printed circuit board.

2. The method of claim 1 wherein said step of forming a plurality of posts comprises the steps of:

attaching a cap to the active side of the substrate;

patterning the cap to form a plurality of trenches, the plurality of trenches defining the plurality of posts.

3. The method of claim 2 wherein said step of attaching a cap comprises the step of coupling the cap to the active side of the substrate.

4. The method of claim 2 wherein said step of attaching a cap comprises the step of spinning on the cap made of an encapsulant material.

5. The method of claim 2 wherein said step of attaching a cap comprises the step of growing the cap on the active side of the substrate.

6. The method of claim 2 wherein said step of patterning the cap comprises the step of photo imaging the cap material.

7. The method of claim 2 wherein said step of patterning the cap comprises the step of etching the cap material.

8. The method of claim 2 wherein said step of patterning the cap comprises the step of stenciling the cap material.

9. The method of claim 2 wherein said step of forming a plurality of posts comprises the step of:

stenciling the plurality of posts on to the active side of the substrate.

10. The method of claim 1 wherein said step of forming a plurality of posts comprises the step of:

coupling a sheet of preformed material to the active side of the substrate, the sheet of material including the plurality of posts.

11. The method of claim 1 further comprising depositing a first insulating layer over the plurality of contact areas, prior forming the plurality of posts.

12. The method of claim 1 further comprising depositing a second insulating layer over the plurality of posts.

13. The method of claim 1 wherein the step of forming the plurality of posts further forms a center area.

14. The method of claim 13 wherein said step of forming the conductive layer further forms the conductive layer over a top of the center area, allowing the center area to act as a heat sink.

15. The method of claim 2 further comprising the step of thinning the cap prior to the step of patterning the cap.

16. The method of claim 15 wherein said step of thinning the cap comprises sandblasting and etching the cap.

17. The method of claim 15 wherein said step of thinning the cap comprises grinding the cap.

18. The method of claim 15 wherein said step of thinning the cap comprises thinning the cap until it is between 3–15 mils in height.

19. The method of claim 1 further comprising depositing a plurality of metal beams over said contact areas to extend said contact areas, prior to the step of forming the plurality of posts.

20. The method of claim 19 further comprising depositing a barrier layer over the contact areas prior to depositing the metal beams.

21. A method of making an electronic component package for an electronic component having a plurality of contacts, the method comprising the steps of:

depositing gold beams over the plurality of contacts, the gold beams in electrical contact with the plurality of contacts;

depositing a first insulating layer over the electronic component covering the metal beams;

coupling a cap to the electronic component covering the first insulating layer;

patterning the cap to form a plurality of trenches, the trenches defining a plurality of posts and a center area, and the trenches exposing the first insulating layer over the metal beams;

depositing a second insulating layer over the electronic component, covering the posts, and the center area;

etching all layers above the gold beams, thereby exposing at least part of the gold beams;

depositing a conductive layer over the plurality of posts, the conductive layer making electrical contact between the gold beams and the plurality of posts.

22. An electronic component package of an electronic component having a plurality of contact areas on an active side, the electronic component package comprising:

a plurality of posts on the active side of the substrate of the electronic component;

a conductive layer for electrically coupling each one of the plurality of contact areas with its respective one of the plurality of posts, the conductive layer further for contacting traces on a printed circuit board.

23. The electronic component package of claim 22 wherein said plurality of posts comprises:

a cap, the cap patterned to form a plurality of trenches; and the plurality of trenches defining the plurality of posts.

24. The electronic component package of claim 23 wherein the cap is attached to the active side of the substrate using a glue.

25. The electronic component package of claim 22 wherein said plurality of posts is comprised of stenciled material.

26. The electronic component package of claim 22 wherein said plurality of posts comprises spun on encapsulant material.

27. The electronic component package of claim 22 wherein said plurality of posts comprises material which is grown on the active side of the substrate.

28. The electronic component package of claim 22 wherein said plurality of posts comprises photoimaged material.

29. The electronic component package of claim 22 wherein said plurality of posts is etched material.

30. The electronic component package of claim 22 wherein said plurality of posts is stenciled material.

31. The electronic component package of claim 22 wherein said plurality of posts comprise a sheet of preformed material, the sheet of preformed material including the plurality of posts.

32. The electronic component package of claim 22 further comprising a first insulating layer over the plurality of contact areas, underneath the plurality of posts.

33. The electronic component package of claim 22 further comprising a second insulating layer over the plurality of posts.

34. The electronic component package of claim 22 further comprising a center area.

35. The electronic component package of claim 34 wherein said conductive layer further overlays a top of the center area, allowing the center area to act as a heat sink.

36. The electronic component package of claim 23 wherein the cap comprises is between 3–15 mils in height.

37. The electronic component package of claim 22 further comprising a plurality of metal beams over said contact areas to extend said contact areas, underneath the plurality of posts.

38. The electronic component package of claim 37 further comprising a barrier layer over the contact areas underneath the metal beams.

* * * * *